United States Patent
Takagi et al.

(10) Patent No.: US 6,455,338 B1
(45) Date of Patent: Sep. 24, 2002

(54) METHOD OF MANUFACTURING AN INTEGRATED SEMICONDUCTOR LASER-MODULATOR DEVICE

(75) Inventors: Kazuhisa Takagi, Tokyo (JP); Hitoshi Tada, Tokyo (JP); Tohru Takiguchi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/400,531

(22) Filed: Sep. 21, 1999

(30) Foreign Application Priority Data

Mar. 29, 1999 (JP) .......................................... 11-085473

(51) Int. Cl.[7] .............................................. H01L 21/20
(52) U.S. Cl. ............................. 438/24; 438/29; 438/31; 438/32
(58) Field of Search ......................... 372/96, 50, 46, 372/26; 438/22, 23, 24, 29, 31, 32, 41, 44

(56) References Cited

U.S. PATENT DOCUMENTS 5,436,195 A * 7/1995 Kimura et al. ................. 438/24
5,459,747 A * 10/1995 Takiguchi et al. ............ 372/50
5,539,763 A * 7/1996 Takemi et al. ................. 372/50
5,548,607 A * 8/1996 Tsang ............................ 372/50

FOREIGN PATENT DOCUMENTS

| JP | 7176827      | 7/1995  | ............. H01S/3/18 |
| JP | 08-288592 A  | * 11/1996 | |
| JP | 08-335745 A  | * 12/1996 | |

OTHER PUBLICATIONS

Holonyak et al., "IR-red GaAs-AlAs Superlattice Laser Mono-lithically Integrated In A Yellow-gap Cavity", Applied Physics Letters, vol. 39, No. 1, Jul. 1981, pp. 102–103.

* cited by examiner

Primary Examiner—Savitri Mulpuri
(74) Attorney, Agent, or Firm—Leydig, Voit & Mayer, Ltd.

(57) ABSTRACT

An integrated semiconductor laser-modulator device less affected by a fluctuating electric field due to modulating signals applied to the modulator has improved frequency characteristics. The integrated semiconductor laser-modulator includes an active layer, a beam waveguide layer having a bulk structure with a bandgap energy larger than that of the active layer but smaller than that of a laser beam absorption layer having a bulk structure, wherein waveguides of the laser and modulator are connected and aligned, and a cladding layer including a diffraction grating is disposed on top of or beneath the waveguides.

4 Claims, 22 Drawing Sheets

METHOD OF MANUFACTURING AN INTEGRATED SEMICONDUCTOR LASER-MODULATOR DEVICE

BACKGROUND OF THE INVENTION

1. Field of the Invention

This invention relates to an integrated semiconductor laser-modulator device and a manufacturing process of the same. More particularly, it relates to the modulator-integrated semiconductor laser device in which frequency-characteristics have been improved by suppressing an influence of the fluctuation of the electric field due to the modulating signals applied to the modulator, and a manufacturing process thereof.

2. Description of Related Art

In order to popularize the public communication web with optical fibers, it is important to improve the performance of such semiconductor laser devices and the productivity for inexpensively manufacturing the same.

Especially for improving the performance of semiconductor laser devices, it is essential to the laser beam thereof at high frequency in order to transmit an increasing amount of information. Since the fluctuation of wavelength modulation should be minimized to transmit the laser beam a long distance, an external modulation system is generally adapted for modulating the laser beam. A modulator device switches on and off beam transmittance, thereby modulating the laser beam at high frequency, while the semiconductor laser device keeps emitting at a constant level.

Since the external modulation system has difficulties in coupling the modulator with the semiconductor laser beam device and in requiring a lot of components, an integrated semiconductor laser-modulator devices, which are a semiconductor laser device monolithically integrated with a modulator, have been developed to overcome such difficulties.

According to such integrated modulator semiconductor laser device, while is common electrode are connected to a ground, the forward biased current is injected into the semiconductor laser and a reverse biased modulating signals are applied to the modulator. Therefore the structure of a separator region provided between the semiconductor laser and the modulator becomes quite important.

Since a high extinction ratio (i.e. a ratio of beam transmittances between ON-state and OFF-state) can be achieved with a low operating voltage when the semiconductor modulator has a beam absorbing multi quantum well (referred to as MQW hereinafter) structure layer, the MQW beam absorption layer is typically adapted in high rate communicating.

FIG. 27 shows a partially sectional perspective view of a conventional modulator-integrated semiconductor laser device (referred to as a modulator-integrated laser device). FIG. 28 shows a sectional view taken along lines XXVIII—XXVIII of FIG. 27.

In FIG. 27 and FIG. 28, numeral 201 denotes a modulator-integrated laser device, the D region represents a separator/modulator region consisting of a separator region and a modulator region, and the C region represents a laser region.

In FIG. 27 and FIG. 28, numeral 202 denotes a substrate of InP, numeral 204 denotes a laser n-side beam confinement layer of InGaAsP, 206 denotes a MQW active layer of InGaAsP, 208 denotes a laser p-side beam confinement layer of InGaAsP. And a laser waveguide 207 is comprised with the laser n-side beam confinement layer 204, the active layer 206, and the laser p-side beam confinement layer 208.

Numeral 210 denotes a first clad layer of p-InP, numeral 212 denotes a diffractive grating, numeral 214 denotes a second clad layer of p-InP, numeral 216 denotes a contact layer of p$^+$-InGaAs. "n-" is referred to "n-type", and "p-" is referred to "p-type" hereinafter.

Numeral 218 denotes an n-side laser beam confinement layer of n-InGaAsP in the separator/modulator region, numeral 220 denotes a MQW beam absorption layer of InGaAsP in the separator/modulator region consisting of a beam absorption layer 220a in the modulator region and a beam absorption layer 220b in the separator region. Numeral 222 denotes a p-side beam confinement layer of InGaAsP in the separator/modulator region. A waveguide 221 in the separator/modulator region is composed with the n-side beam confinement layer 218 in the separator/modulator region, the beam absorption layer 220, and the p-side beam confinement layer 221 in the separator/modulator region.

Numeral 224 denotes a first embedded layer of InP doped with Fe, numeral 226 denotes a Hall-trap layer of n-InP, and numeral 228 denotes a second embedded layer of InP doped with Fe. The ridge-shaped laser waveguide 207 and the ridge-shaped separator/modulator waveguide 221 have both side surfaces along the laser emitting direction on which the first embedded layer 224, the Hall-trap layer 226, and the second embedded layer 228 are composed to form a current block layer. A window structure 229 is formed at the emitting end surface of the current block layer.

Numeral 230 denotes an insulator layer of SiO$_2$, numeral 231 denotes a separator groove separating the laser region C from the modulator region. Numeral 232 denotes a surface evaporated electrode of Ti/Au. Numeral 234 denotes a p-side laser Au-coated electrode. Numeral 236 denotes a p-side modulator Au-coated electrode. Numeral 232 denotes a surface evaporated electrode. Numeral 240 denotes a common electrode. And numeral 242 denotes an arrow showing the direction of the emitting laser beam.

A conventional modulator-integrated laser device is manufactured as described below.

First by using a MOCVD method, formed on the substrate 12 of n-InP are in sequence, an n-InGaAsP layer of the n-side laser beam confinement layer 204, an InGaAsP MQW layer of the active layer 206, a p-InGaAsP layer of the p-side laser beam confinement layer 208, a p-InP layer of the first clad layer 210, and P-InGaAsP layer for forming the diffractive grating 212.

Next, by using an interference exposing method, the P-InGaAsP layer is etched with a grating shape to form the diffractive grating 212. Thereafter a P-InP layer of the first clad layer 210 is disposed entirely to embed the diffractive grating 212.

A dielectric layer of material such as SiO$_2$ and SiN is formed on the p-InP layer of the first clad layer 210, and etched to form a stripe-shaped dielectric layer that includes the diffractive gratings 212 and forms the laser waveguide. Then layers disposed in the region including the separator/modulator region D are etched with using the dielectric layer as a mask until the substrate 202 is exposed.

Next, while retaining the stripe-shaped dielectric layer, by using a MOCVD method, subsequently formed are, the n-InGaAsP of the n-side laser beam confinement layer 218 in the separator/modulator region, the MQW layer of InGaAsP of the beam absorption layer 220 in the separator/modulator region D, and the InGaAsP layer of the p-side beam absorption layer 222 in the separator/modulator region.

Next, after the stripe-shaped dielectric layer is removed, again an another dielectric layer of material such as SiO$_2$ and SiN is deposited to form the waveguide in the separator/modulator region D and the laser region C, and etched to make the stripe-shaped dielectric layer with stripe-shaped which overlaps over the separator/modulator region D and the laser region C. Then the entire layers are wet-etched with HBr (hydrogen bromide) using a mask of this dielectric layer until the substrate 202 is exposed so that the waveguide is shaped as a ridge. When the window structure 229 is formed, the stripe-shaped dielectric layer is such that the layers at the emitting end surface can be also etched away.

Next, while retaining the stripe-shaped dielectric layer, the InP layer doped with Fe of the first embedded layer 224, the n-InP layer of the Hall-trap layer 226, and the InP layer doped with Fe of the second embedded layer 228 are grown by using the MOCVD method.

After removing the stripe-shaped dielectric layer, a p-InP layer of a second clad layer 214 and a $p^+$-InGaAs of a contact layer 216 are grown entirely by using the MOCVD method.

Next, the contact layer 216 and the second clad layer 214 in a region corresponding to separator region are partially etched to form a separator groove 231.

After an insulator layer 230 is entirely deposited by sputtering and etched away at the contact electrode in the modulator region and the laser region C, the Ti/Au layer and the Au-coated layer are formed on the surface evaporated electrode 232.

After a backside of the substrate 202 is thinned so that the substrate is approximately 100 micrometer thick, a sequence of AuGe/Ni/Ti/Pt/Ti/Pt/Au layer of the evaporated electrode is formed by depositing, and the Au-coated layer is patterned to form the common electrode 240 thereon.

According to the modular-integrated semiconductor laser device 201 formed as described above, the forward biased voltage are applied between the laser electrode 234 and the common electrode 240 to inject the current into the active layer 206, so that the laser beam emitted in the laser region C is guided through the separator/modulator waveguide 221 into the separator/modulator region D. And the modulating signals of reverse biased voltage are applied between the modulator electrode 236 and the common electrode 240 to provide the beam absorption layer 220a with an electric field corresponding to the modulating signals, so that the laser beam 242 is modulated and emitted at high frequency and at high extinction rate because of the Stark quantum confinement effect.

The conventional modular-integrated laser device 201 is composed as described above, the p-side laser electrode 234 is spaced away through the separator groove 231 and the insulator layer 230 provided thereon from the p-side modulator electrode 236 to prevent the wavelength of the laser beam 242 from fluctuating.

However because the beam absorption layer 220a of the modulator is formed of MQW, while the extinction rate is advantageously high at the low voltage, the refractive index tends to fluctuate due to the unstable electric field caused by the modulating signals. As the result, the fluctuation of the wavelength because of the unstable refractive index can not be always suppressed. When the wavelength fluctuates too much, it is impossible to transmit the beam especially in long distance.

The laser region C is connected through a composition face to the separator/modulator region D, which is formed by re-growing. Thus the separator/modulator region D is formed by a single butt-joint method to have a structure with even bandgap.

In operating such modulator-integrated semiconductor laser devices 201, the modulating signals are applied between the modulator electrode 236 and the common electrode 240. The electric field generated by the modulating signals arises not only between the modulator electrode 236 and the common electrode beneath the modulator electrode 236, but also between the modulator electrode 236 and the common electrode in the laser region C. Thus the electric field arises beneath the separator groove 231 in the separator/modulator region 221, which is referred to as a "leakage electric field" hereinafter.

As described, the beam waveguide layer 220b and the beam absorption layer 220a are formed by a single butt-joint method to have a structure with even bandgap. Therefor the emitted beam is absorbed responding to the electric field caused not only by the modulating signals in the beam absorption layer 220a beneath the modulator electrode, but also by a minor electric field derived in the beam waveguide layer 220b beneath the separator groove 231, which acts as a beam absorption layer. This is the problem to be solved.

If the beam waveguide layer 220b acts as the beam absorption layer, since the electric field in the beam waveguide 220b is less than that in the absorption layer 220a, the size of the depletion layer at the p-n junction of the beam waveguide layer 220b does not expand so that the junction capacitance increases. Consequently since the beam is absorbed much in low frequency area and little in high frequency of the modulating signals, the entire frequency-characteristics sometimes shows not flat and distorted with an undulant shape.

A conventional example is described in the Japanese Laid-Open publication of JP 8-335745A, showing a modulator-integrated semiconductor laser device, comprising waveguides in the laser region, the separator region, and the modulator region, of which bandgap wavelength are different.

According to the publication, the modulator-integrated semiconductor laser device formed by the butt-joint method is designed to shorten the wavelength by implanting ion into the separator region. However, it does not disclose that the beam absorption layer in the modulator region is formed of the bulk structure, nor does that the separator region and separator region are disposed through the composition face, that is different from the structure described hereinafter according to the present invention.

An another conventional example is described in the Japanese Laid-Open publication of JP 7-176827A showing a modulator-integrated semiconductor laser device, comprising waveguides in the semiconductor laser region, the modulator region, and the transition region, which are simultaneously disposed by the selective growth method. Further it discloses that the emitting wavelength in the semiconductor laser region is greater than that of the modulator region, and that the emitting wavelength in the semiconductor laser region and the modulator region is greater than that in the transition region intervening between both regions. But it does not disclose that the laser region are formed and aligned by the butt-joint method nor does that the active layer, the beam waveguide layer, and the beam absorption layer compose the MQW structure, that is different from the structure described hereinafter according to the present invention.

SUMMARY OF THE INVENTION

This invention is to resolve the above-mentioned problems, and the first object is to provide a modulator-integrated semiconductor laser device, in which a modulator is integrated with a semiconductor laser device, having an improved frequency-characteristics by reducing the influence of the fluctuating electric field generated by the modulator signals applied to the modulator.

The second object is to provide the modulator-integrated semiconductor laser device including the modulator of a bulk structure to suppress the fluctuation of the beam absorption ratio caused by the electric field of the modulating signals thereby reducing the fluctuation of the refractive index due to the fluctuation of the beam absorption ratio, and also the laser device including the beam waveguide with a bulk structure in the separator region between the semiconductor laser and the modulator to suppress the beam absorption in the beam waveguide due to the leakage electric field. As the result, the laser device performs a good frequency-characteristics and high power output.

The third object is to provide the modulator-integrated semiconductor laser device, comprising the semiconductor laser region, the modulator region, and separator region therebetween, wherein the waveguides in each region are one another connected and aligned through the composition faces, and also comprising a beam waveguide of bulk structure in the separator region to suppress the influence of the fluctuating electric field caused by the modulating signals applied to the modulator thereby improving the frequency-characteristics thereof.

The forth object is to provide a process for easily manufacturing the modulator-integrated semiconductor laser device, in which the frequency-characteristics is improved.

A modulator-integrated semiconductor laser device according to the present invention comprises a semiconductor substrate of a first conductive type, and the substrate has a first and second main surface. The device has a first ridge-shaped waveguide disposed on a part of the first main surface of the semiconductor substrate, and the first waveguide has an active layer and a longitudinal direction. The device also has a second ridge-shaped waveguide formed on the semiconductor substrate extending along the longitudinal direction to connect to the first waveguide, and the second waveguide includes a beam waveguide layer of a bulk structure of bandgap greater than that of the active layer. The device includes a third ridge-shaped waveguide formed on the semiconductor substrate extending along the longitudinal direction to connect to the second waveguide. And the third waveguide has a beam absorption layer of a bulk structure of bandgap greater than that of the active layer but less than that of the beam waveguide layer. Further the device has a first ridge-shaped clad layer of a second conductive type, deposited on the first, second, and third waveguides. The device includes a second ridge-shaped clad layer sandwiched between either one of the first clad layer or the substrate on one hand, and the first, second and third waveguides on the other hand. A diffractive grating is formed and embedded within the second clad layer corresponding to the first waveguide. A current block layer is deposited on the semiconductor substrate positioned on both sides of the longitudinal direction along the first and second clad layer and the first, second, and third waveguides. A first electrode is deposited over the first clad layer opposing to the active layer and a second electrode spaced from the first electrode and deposited over the first clad layer opposing to the beam absorption layer. Also a third electrode is deposited on the second main surface of the semiconductor substrate. The device formed as described above is improved in the frequency-characteristics by suppressing the influence of the unstable electric field due to the modulating signals applied to the modulator, in other words by stabilizing the fluctuating absorption ratio caused by the electric field of the modulating signals to minimize the fluctuation of the refractive index due to the fluctuating absorption ratio, and also by forming the beam waveguide of a bulk structure in the separator region sandwiched between semiconductor laser region and the modulator region to suppress the beam absorption in the beam waveguide due to the leakage electric field.

Further the second waveguide is connected to the first waveguide through a first composition face, so that high design flexibility is permitted while keeping the frequency-characteristics improved.

Further the third waveguide is connected to the second waveguide through a second composition face and wherein the beam waveguide layer and the beam absorption layer are formed of a bulk crystal structure, therefore the beam absorption is reduced and the frequency characteristics is improved.

Also both of the waveguide layer and the beam absorption layer are formed by compositionally disordering, and each of the waveguide layers has a multi quantum well structure, and a compositional disordering ratio of the beam waveguide layer is higher than that of the beam absorption layer, so that the frequency-characteristics is improved with a simple structure.

Also the beam waveguide layer of the second waveguide is thinner towards the first waveguide and thicker towards the third waveguide, so that the beam absorption is reduced and the frequency characteristics is improved.

A modulator-integrated semiconductor laser device comprises a semiconductor substrate of a first conductive type, and the substrate has a first and second main surfaces. The device has a first ridge-shaped waveguide deposited on a part of the first main surface of the semiconductor substrate, and the first waveguide has an active layer and a longitudinal direction. The device also has a second ridge-shaped waveguide formed on the semiconductor substrate extending along the longitudinal direction to connect to the first waveguide through a first composition face. And the second waveguide includes a beam waveguide layer of bandgap greater than that of the active layer. A third ridge-shaped waveguide is formed on the semiconductor substrate extending along the longitudinal direction to connect to the second waveguide through a second composition face. The third waveguide includes a beam absorption layer of a multi quantum well structure of bandgap greater than that of the active layer but less than that of the beam waveguide layer. A first ridge-shaped clad layer of a second conductive type, is deposited on the first, second, and third waveguides. A second ridge-shaped clad layer sandwiched between either one of the first clad layer or the substrate on one hand, and the first, second and third waveguides on the other hand. A diffractive grating is formed and embedded within the second clad layer corresponding to the first waveguide. A current block layer is deposited on the semiconductor substrate positioned on both sides of the longitudinal direction along the first and second clad layer and the first, second, and third waveguides. A first electrode is deposited over the first clad layer opposing to the active layer. A second electrode is spaced from the first electrode and deposited over the first clad layer opposing to the beam absorption layer. Also a third electrode is deposited on the second main surface of the semiconductor substrate. The device described above therefore is improved in the frequency-characteristics by suppressing the beam absorption and the influence of the electric field caused by the modulating signals applied to the modulator.

Further since the beam waveguide layer is formed of a bulk crystal structure, the frequency-characteristics is improved by suppressing the beam absorption and the influence of the electric field caused by the modulating signals applied to the modulator.

Further since the beam waveguide layer is formed of a multi quantum well structure, the frequency-characteristics is improved by reducing the beam absorption.

A process for manufacturing a modulator-integrated semiconductor laser device according to the present invention comprises steps as described below. A first step is preparing a layer structure including, a first waveguide of a first conductive type deposited on a first main surface of a semiconductor substrate, the first waveguide having an active layer, a first clad layer of a second conductive type semiconductor deposited on the first waveguide, and a second clad layer of a predetermined conductive type semiconductor having a diffractive grating embedded between either one of the first clad layer or the substrate and the first waveguide. A second step is forming a first stripe-shaped dielectric layer of length less than that of the substrate extending along a laser emitting direction and overlapping the diffractive grating, and etching the layer structure with using the first dielectric layer as a mask until the semiconductor substrate is exposed. A third step is forming, in sequence, a second waveguide having a beam waveguide layer of bandgap greater than that of the active layer and a third clad layer of the second conductive type semiconductor with the first dielectric layer as a mask on an etched and exposed surface of the semiconductor substrate. A fourth step is removing the first dielectric layer, forming a stripe-shaped second dielectric layer on a surface of the second and third clad layers, and the second dielectric layer extending along the laser emitting direction and covering over an portion as the first dielectric layer, and etching with the second dielectric layer as a mask until the substrate is exposed. A fifth step is forming a third waveguide and a forth clad layer of the second conductive type semiconductor on the etched and exposed surface of the substrate, the third waveguide including a beam absorption layer of semiconductor having bandgap greater than that of the active layer but less than that of the beam waveguide layer; and a sixth step of sub-steps of, removing the second dielectric layer, forming a stripe-shaped third dielectric layer on a surface of the second, third, and third clad layers, the third dielectric layer extending along the laser emitting direction and covering over an portion as the second dielectric layer, etching with using the third dielectric layer as a mask until the substrate is exposed to form a ridge, and forming a current block layer on an etched and exposed surface of the substrate. Therefore the first, second, and third waveguides are individually formed so that a high design flexibility is permitted in easily manufacturing the modulator-integrated semiconductor laser device with the improved frequency-characteristics.

A process for manufacturing a modulator-integrated semiconductor laser device comprises steps as described below. A first step is preparing a layer structure including, a first waveguide of a first conductive type deposited on a first main surface of a semiconductor substrate, the first waveguide having an active layer, a first clad layer of a second conductive type semiconductor deposited on the first waveguide, and a second clad layer of a predetermined conductive. type semiconductor having a diffractive grating embedded between either one of the first clad layer or the substrate and the first waveguide. A second step is forming a first stripe-shaped dielectric layer on the first clad layer having length less than that of the substrate extending along a laser emitting direction and overlapping the diffractive grating, and forming an opposing pair of second dielectric layers on the first clad layer defining a stripe-shaped space between them, each of the second dielectric layer extending along the laser emitting direction, the space having an end area facing to an end surface of the first dielectric layer, each of the second dielectric layer having one end adjacent to the first stripe-shaped dielectric layer and the other end, and having width narrower at the one end than that at the other end, and etching with using the first and second dielectric layers as masks until the substrate is exposed. A third step is forming by the selective growth, in sequence, a second waveguide of a semiconductor layer of bandgap greater than that of the active layer and a third clad layer of the second conductive type semiconductor with using the first and second dielectric layer as masks on an etched and exposed surface of the substrate; a fourth step including sub-steps of, removing the first and second dielectric layers, forming a stripe-shaped third dielectric layer on a surface of the second and third clad layers, the third dielectric layer extending along the laser emitting direction and covering as the second dielectric layer, etching with using the third dielectric layer as a mask until the substrate is exposed to form a ridge, and forming a current block layer on an etched and exposed substrate. Therefore the separator region waveguide and the modulator region waveguide are simultaneously formed, and steps can be simplified.

A process for manufacturing a modulator-integrated semiconductor laser device comprises steps as described below. A first step is forming an opposing air of first dielectric layers on a first main surface of a semiconductor substrate of a first conductive type, extending along a laser emitting direction and defining a stripe-shaped space between them, each of the first dielectric layer having a longitudinal direction in the laser emitting direction from one end of the semiconductor substrate to an inside position and having width narrower at the inside position than that at the one end, and forming by a selective growth a first waveguide having a first semiconductor layer of bandgap less than that of the semiconductor substrate with using the first dielectric layer as a mask until the substrate is exposed. A second step is removing the first dielectric layer, forming a second stripe-shaped dielectric layer on a surface of the first waveguide formed between the pair of first dielectric layers, having same the longitudinal length as the first dielectric layer, and etching with using the second dielectric layer as a mask until the semiconductor substrate is exposed. A third step is forming by the selective growth a second waveguide with using the second dielectric layer as a mask on an etched and exposed surface of the semiconductor substrate, the second waveguide having an active layer of bandgap less than that of the first semiconductor layer. A forth step is removing the second dielectric layer, forming a first clad layer of the second conductive type semiconductor and a beam guide layer of the second conductive type semiconductor in sequence on the first and second waveguides, etching the beam guide to form a diffractive grating opposing to the active layer, and embedding the diffractive grating within the second clad layer of the second conductive type semiconductor. A fifth step is forming a third stripe-shaped dielectric layer on the clad layer, extending along the laser emitting direction, having width narrower than that of the second dielectric layer and length covering over the first semiconductor layer and the active layer, etching with using the third dielectric layer as a mask until the semiconductor substrate is exposed to form a ridge, and forming a current block layer on an etched and exposed semiconductor substrate. Therefore the separator region waveguide and the modulator region waveguide are simultaneously formed, and steps can be simplified.

A process for manufacturing a modulator-integrated semiconductor laser device comprises steps as described below A first step is preparing a layer structure including, a first clad layer of a first conductive type semiconductor deposited on a first main surface of a semiconductor substrate of the first conductive type semiconductor, opposing to a diffractive grating extending along a laser emitting direction and having length less than that of the semiconductor substrate. A second step is forming an opposing pair of first dielectric layers on a surface of a first clad layer, extending along the laser emitting direction and defining a stripe-shaped space between them, each of the first dielectric layer having one end adjacent to the diffractive grating and the other end, and having width narrower at the one end than that at the other end, and forming by a selective growth a first waveguide with using the first dielectric layer as a mask on the substrate, the first waveguide having an active layer of bandgap less than that of the first semiconductor layer. A third step is forming a second stripe-shaped dielectric layer on a surface of the first waveguide, having a longitudinal length as the first dielectric layer formed between the pair of first dielectric layers, etching with using the second dielectric layer as a mask until the semiconductor substrate exposed; a third step for forming by the selective growth a second waveguide with using the second dielectric layer as a mask on the semiconductor substrate, the second waveguide having an active layer of bandgap less than that of the first semiconductor layer. A forth step is removing retaining dielectric layers, and forming a second clad layer on the first and second waveguides. A fifth step including sub-steps of, forming a third stripe-shaped dielectric layer on the clad layer, extending along the laser emitting direction, having width narrower than that of the second dielectric layer and length covering over the first semiconductor layer and the active layer, etching with using the third dielectric layer as a mask until the semiconductor substrate is exposed to form a ridge, and forming a current block layer on an etched and exposed semiconductor substrate. Therefore the separator region waveguide and the modulator region waveguide are simultaneously formed, and steps can be simplified.

BRIEF DESCRIPTION OF THE DRAWINGS

The present invention will become more fully understood from the detailed description given hereinafter and the accompanying drawings which are given by way of illustration only, and thus are not limitative of the present invention, wherein.

DETAILED DESCRIPTION OF PREFERRED EMBODIMENTS (Embodiment 1)

Figure 1:
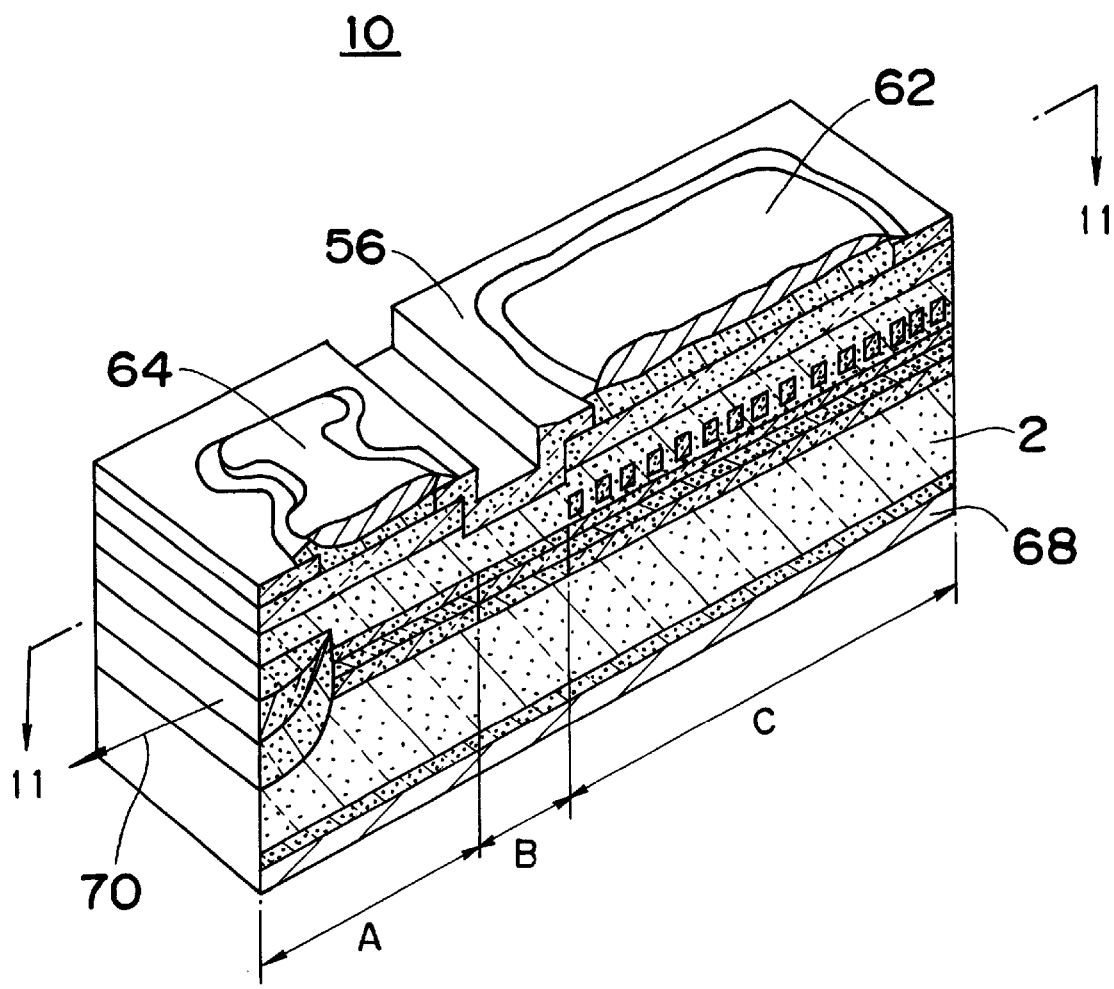
FIG. 1 is a partially sectional perspective view of the modulator-integrated semiconductor laser device according to the present invention.

FIG. 1 is a partially sectional perspective view of a first embodiment of a modular-integrated semiconductor laser device according to the present invention.

Figure 2:
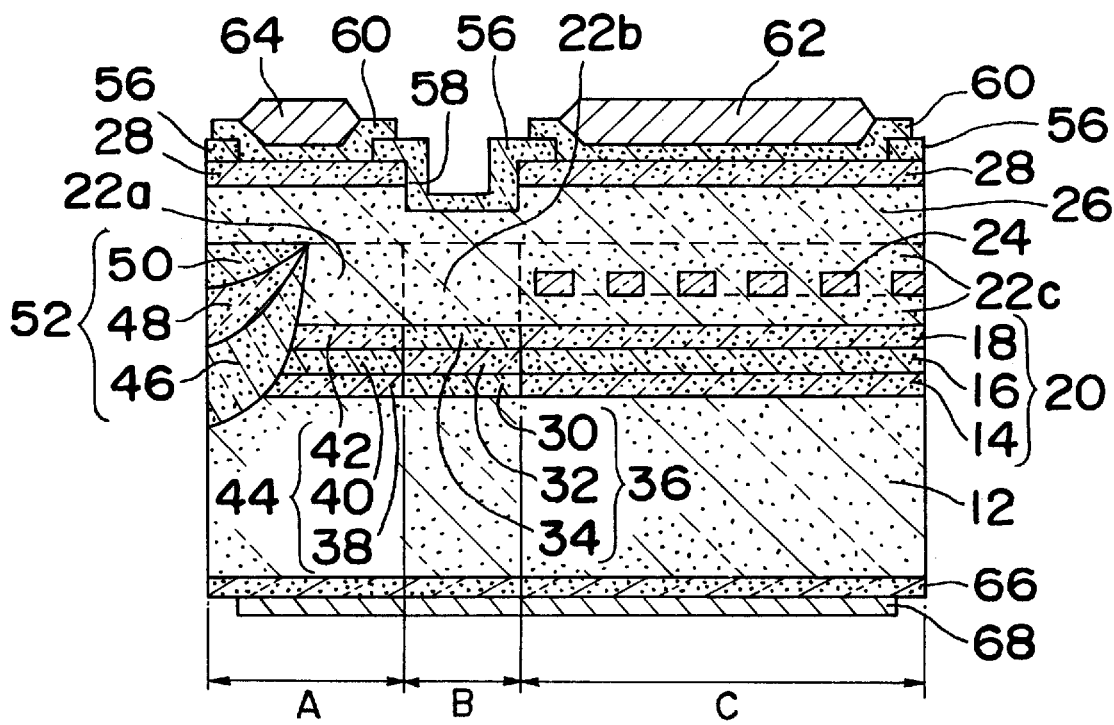
FIG. 2 is a sectional view taken along lines II—II of FIG. 1.

FIG. 2 is a sectional view taken along lines II—II of FIG. 1.

A modular-integrated semiconductor laser device with 10 Gb/s for use of a main-line communication, by a way of one example, is described hereinafter. The modular-integrated semiconductor laser device is a complex optical device integrating an external modulator of an electric filed absorbing type into a mono-wavelength laser.

In FIG. 1 and FIG. 2, numeral 10 denotes a modular-integrated semiconductor device according to the present invention, a region A, B, and C denotes a modulator region, a separator region, and laser region, respectively.

In FIG. 1 and FIG. 2, numeral 12 denotes a substrate of n-InP, numeral 14 denotes an n-side beam confinement layer with stripe-shaped which is provided to a portion C at one end of the substrate 12. Each material representation of InGaAsP including this n-InGaAsP means InGaAsP-based material having a predetermined composition ratio hereinafter.

Numeral 16 denotes a MQW active layer of InGaAsP deposited on the n-side laser beam confinement layer 14, and numeral 18 denotes a p-side laser beam confinement layer deposited on the active layer 16. The n-side laser beam confinement layer 14, the active layer 16, and the p-side laser beam confinement layer 18 are deposited with ridge-shaped to compose a laser waveguide 20 as a first waveguide.

Numeral 22c denotes a first clad layer of p-lnP deposited on the laser waveguide 20. Numeral 24 denotes a diffractive grating opposing to the active layer 16 and being embedded within the first clad layer 22c. Numeral 26 denotes a second clad layer of p-InP deposited on the first clad layer 22 (including 22a, 22b, and 22c) entirely covering over the modulator region A, the separator region B, and the laser region C, respectively. Numeral 28 denotes a contact layer of $p^+$-InGaAs provided on the second clad layer 26 in the modulator region A and the laser region C except in the separator region B.

Numeral 30 denotes a separator region n-side laser beam confinement layer of n-InGaAsP deposited on the substrate 12 in the separator region B. Numeral 32 denotes a beam waveguide deposited on the separator region n-side beam confinement layer 30, which is composed of a bulk structure of InGaAsP with material of bandgap greater than that of the active layer 16.

The bulk structure may be formed by re-growing crystal, or may be so-called a bulk-like structure compositionally disordered by implanting ions into the MQW layer of InGaAsP.

Numeral 34 denotes a separator region p-side beam confinement layer of p-InGaAsP deposited on the beam waveguide 32. Numeral 22b is a first clad layer deposited on the separator region p-side beam confinement layer 34.

The separator region n-side beam confinement layer 30, the beam waveguide 32, and the separator region p-side beam confinement layer 34 are deposited with ridge-shaped to compose a separator region waveguide 36 as a second waveguide, which is connected to the laser waveguide 20 along the laser beam emitting direction. When the separator region n-side beam confinement layer 30, the beam waveguide layer 32, and the separator region p-side beam confinement layer 34 are formed by re-growing, the laser waveguide 20 with the active layer 16 is connected to the separator region waveguide 36 with the beam waveguide layer 32 through the re-growing interface as a composition face. On the contrary, when the beam waveguide 32 and the beam absorption layer 40 are formed of the MOW layers by compositionally disordering at the same time as the active layer 16 is formed, and composed of the bulk structure, then the composition face of the re-growing interface is not formed.

Numeral 38 denotes a modulator region n-side beam confinement layer of n-InGaAsP deposited on the substrate 12 in the modulator region A. Numeral 40 denotes a beam absorption layer deposited on the modulator region n-side beam confinement layer 38. Numeral 42 denotes a modulator region p-side beam confinement layer of p-InGaAsP deposited on the beam absorption layer 40.

The beam absorption layer 40 is composed of a bulk-structure of InGaAsP with material of bandgap greater than that of the active layer 16 but less than that of the beam waveguide 32 in the separator region B.

The bulk structure may be formed by re-growing crystal, or may be so-called a bulk-like structure compositionally disordered by implanting ions into the MQW layer of InGaAsP. Numeral 22a denotes a first clad layer of p-InP deposited on the modulator region p-side beam confinement layer 34.

The modulator region n-side beam confinement layer 38, the beam absorption layer 40, and the modulator region p-side beam confinement layer 42 are deposited with ridge-shaped to compose a modulator region waveguide 44 as a third waveguide, which is connected to the beam waveguide 36 along the laser beam emitting direction. When the modulator region n-side beam confinement layer 38, the beam absorption layer 40, and the modulator region p-side beam confinement layer 42 are formed by re-growing, the modulator region waveguide 44 is connected to the separator region waveguide 36 through the re-growing interface as the composition face. But when composed of the bulk structure of MQW by compositionally disordering, then the composition face of the re-growing interface is not formed.

Numeral 46 denotes a first embedded layer of InP doped with Fe, numeral 48 denotes a Hall-trap layer of n-InP deposited on the first embedded layer 46, and numeral 50 denotes a second embedded layer of InP doped with Fe and deposited on the Hall-trap layer 48. The first embedded layer 46, the Hall-trap layer 48, and the second embedded layer 50 together compose a window structure at the emitting end surface.

The first embedded layer 46, the Hall-trap layer 48, and the second embedded layer 50 are formed also on both sides of the ridged portion which are formed along the laser waveguide 20, the separator region waveguide 36, and the modulator region waveguide 44 as well as the first clad layer 22 deposited thereon. A current block layer 52 comprises the first embedded layer 46, the Hall-trap layer 48, and the second embedded layer 50.

Numeral 56 denotes an insulator layer of $SiO_2$ formed entirely on the contact layer 28 that has apertures at required portions. Numeral 58 denotes a separator groove separating the laser region C from the modulator region A, which removes a portion of the contact layer 28 between both regions and is dug down to reach the second clad layer 26. Numeral 60 denotes a surface evaporated electrode of Ti/Au formed on the apertures of the insulator layer 56. Numeral 62 denotes a p-side laser electrode of Au-coated as a first electrode, numeral 64 denotes a p-side modulator electrode of Au-coated as a second electrode, numeral 66 denotes a evaporated electrode deposited in sequence of AuGe/Ni/Ti/Pt/Ti/Pt/Au on the backside of the substrate, and numeral 68 denotes an Au-coated common electrode. Numeral 70 denotes an arrow showing the laser beam emitting direction.

Figure 3:
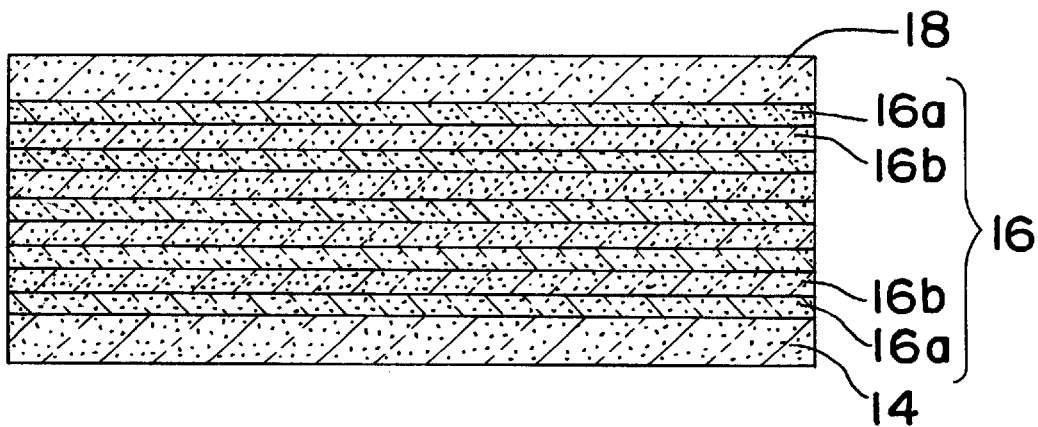
FIG. 3 is a sectional view of the MQW active layer.

FIG. 3 is a sectional view of the MQW active layer 16 of InGaAsP. Numeral 16a denotes a well layer having 3 through 4 nm thick, and there are 7 through 13 well layers in the active layer 16. A barrier layer 16b is formed between each of the well layers 16a. The barrier layer 16b is approximately 10 nm thick. Both of the well layers 16a and the barrier layer 16b are formed of undoped InGaAsP, and the bandgap of the well layers 16a is less than that of the barrier layer 16b.

Figure 5A:
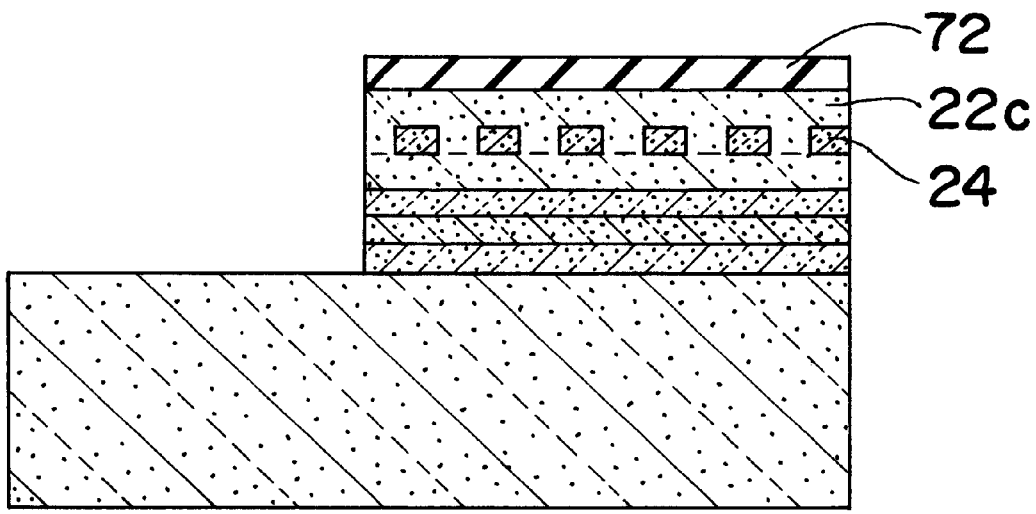
Figure 5B:
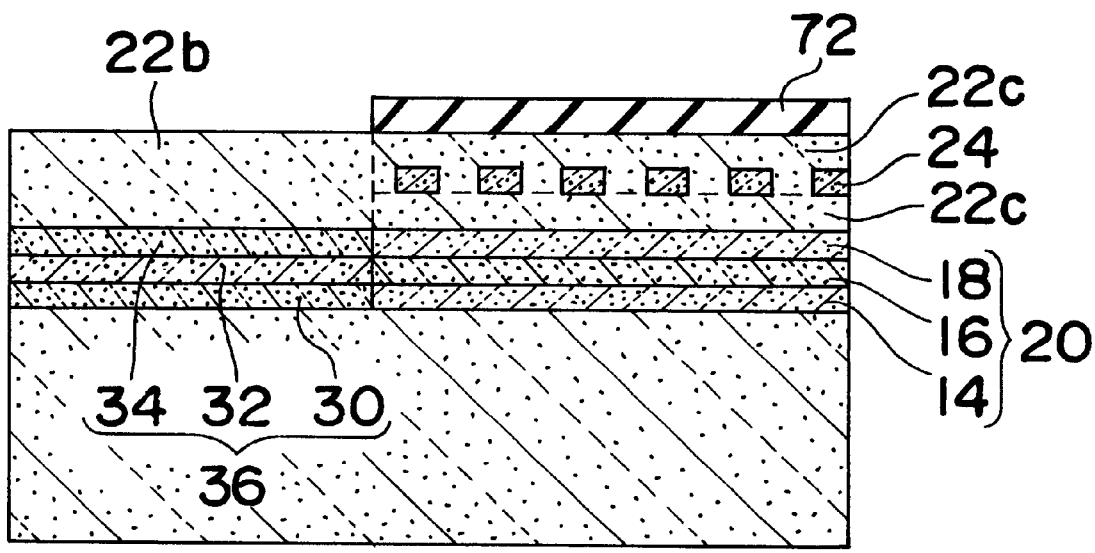
Figure 6:
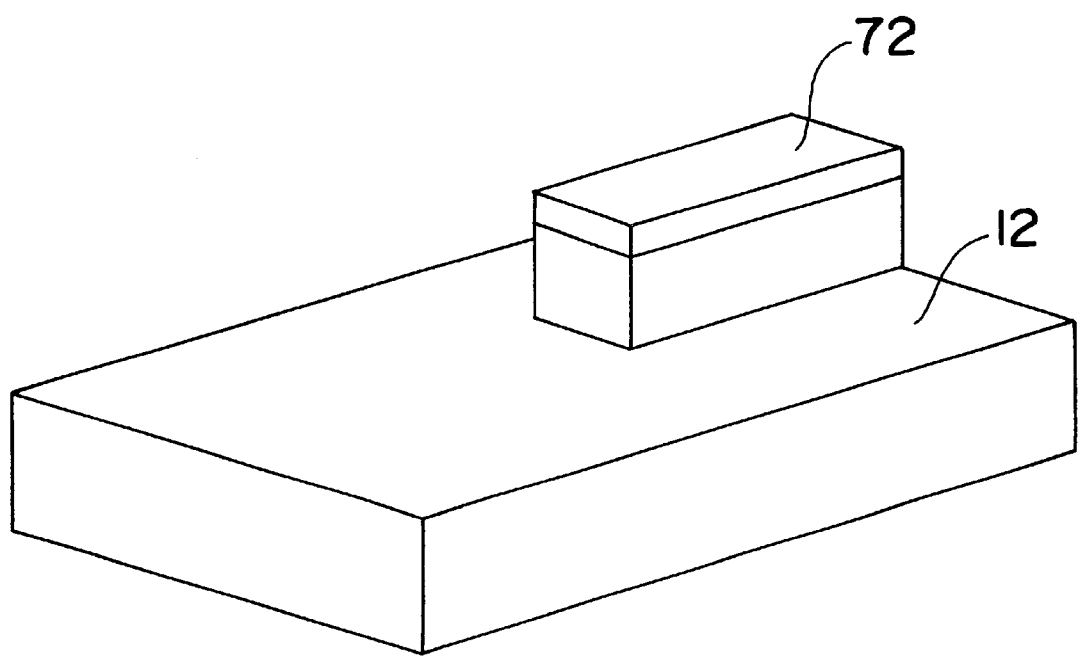
FIG. 6 is a perspective view of the modulator-integrated semiconductor laser device according to the present invention showing one of the manufacturing steps thereof.

A modulator-integrated laser device according to the present invention is manufactured as described below. FIGS. 4a, 4b, 5a, 5b, 7a, 7b, 8a, 8b, 9a, 9b, and FIG. 10 are sectional views of the device showing the manufacturing steps of the modulator-integrated laser device according to the present invention. FIG. 6 is a perspective view of the device in one step.

Figure 4A:
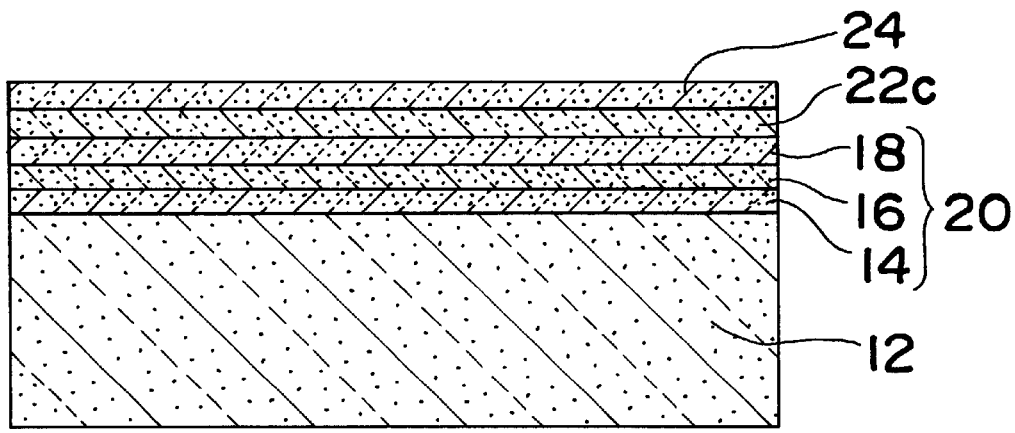
FIGS. 4a through FIG. 5b are sectional views of the modulator-integrated semiconductor laser device according to the present invention showing the manufacturing steps thereof.

First as shown in FIG. 4, on the substrate 12 of n-InP by using a MOCVD method formed are in sequence, an n-InGaAsP layer of the n-side laser beam confinement layer 14, a MQW InGaAsP layer of the active layer, a p-InGaAsP layer of the p-side laser beam confinement layer 18, a p-InP layer of a part of the first clad layer 22c, and P-InGaAsP layer for forming the diffractive grating 24. This step results as shown in FIG. 4a.

Figure 4B:
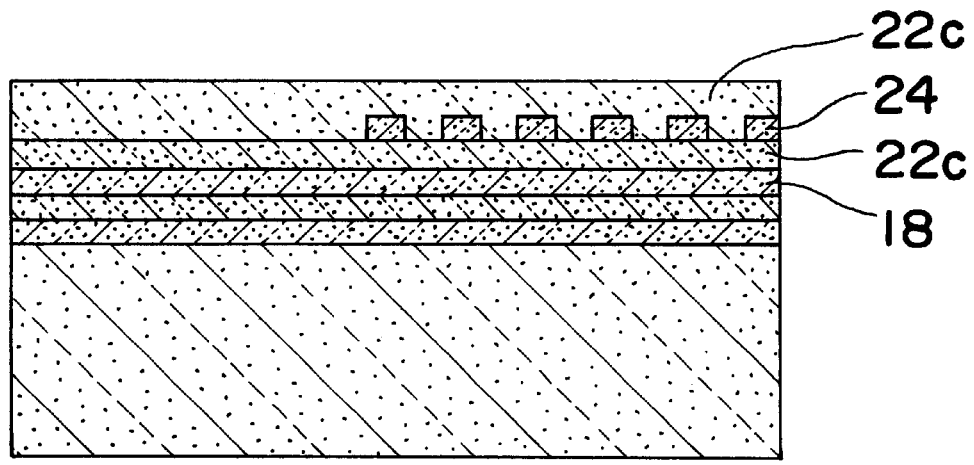

Next, the P-InGaAsP layer is etched with grating-shaped by the interference exposing method for forming the diffractive grating 24. Thereafter a P-InP layer of the first clad layer 22c is formed entirely to embed the diffractive grating 24 within the P-InP layer. This step results as shown in FIG. 4b.

A dielectric layer of material such as $SiO_2$ and SiN is deposited on the p-InP layer of the first clad layer 22, and etched to leave a stripe-shaped dielectric layer 72, which overlaps the diffractive gratings 24, for forming the laser waveguide 20. Then layers deposited in the separator region B and the modulator region A are etched using the dielectric layer 72 as a mask until the substrate 12 is exposed. This step results as shown in FIG. 5a. FIG. 6 is a perspective view of the device of FIG. 5a.

Next, while retaining the stripe-shaped dielectric layer 72, on the exposed substrate 12 by etching, deposited by a MOCVD method are in sequence, an n-InGaAsP layer of the separator region n-side beam confinement layer 30, an undoped InGaAsP layer of the beam waveguide layer 32, a p-InGaAsP layer of the separator region p-side beam confinement layer 34, and a p-InP layer of the first clad layer 22b. The InGaAsP layer of the beam waveguide 32 has a bulk structure formed of bandgap greater than that of the active layer 16. This step results as shown in FIG. 5b.

Figure 7A:
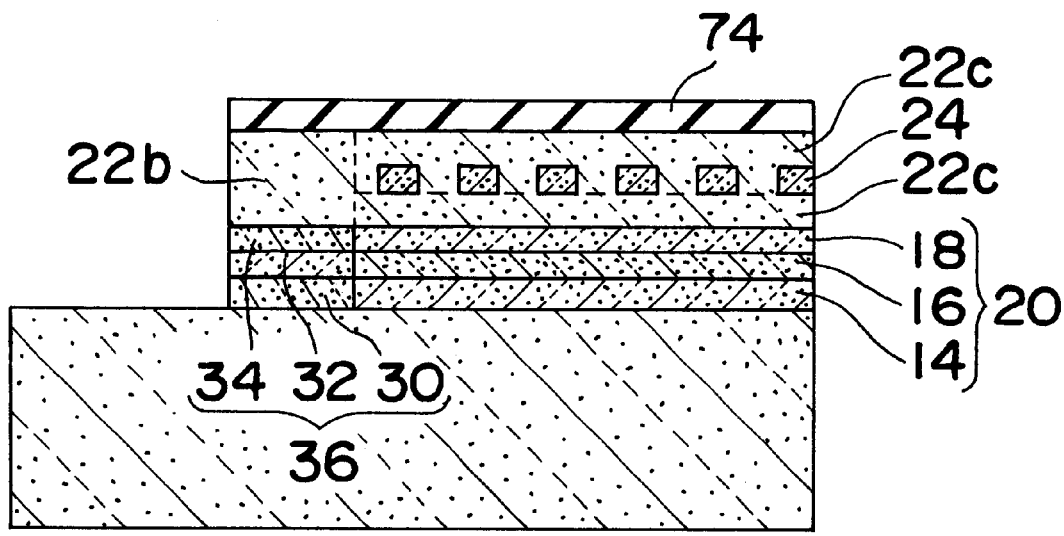
FIG. 7a through FIG. 10 are sectional views of the modulator-integrated semiconductor laser device according to the present invention showing the manufacturing steps thereof.

Next, the stripe-shaped dielectric layer 72 is removed, again a dielectric layer of material such as $SiO_2$ and SiN is deposited on the p-InP layer of the first clad layer 22b and 22c. A stripe-shaped dielectric layer 74 is formed, which overlaps the diffractive gratings 24 and extends along the beam emitting direction to form the laser waveguide 20 and the separator waveguide 36. The layers deposited in the regions including the modulator region A is etched with a mask of the dielectric layer 74 until the substrate 12 is exposed. This step results as shown in FIG. 7a.

Figure 7B:
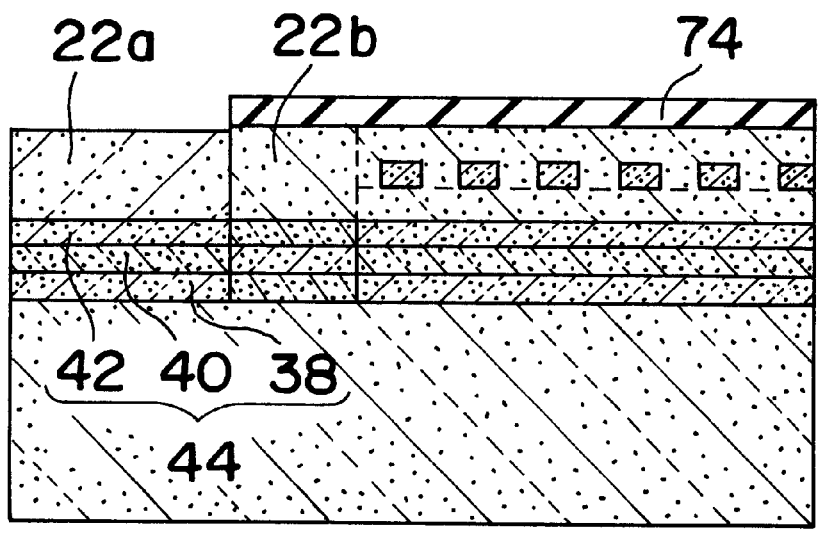

Next, while retaining the stripe-shaped dielectric layer 74, on the exposed substrate 12 by etching, deposited by a MOCVD method are in sequence, an n-InGaAsP layer of the modulator region n-side beam confinement layer 38, an undoped InGaAsP layer of the beam absorption layer 40, a p-InGaAsP layer of the modulator region p-side beam confinement layer 42, and a p-InP layer of the first clad layer 22a. The beam absorption layer 40 has a bulk crystal structure with material of bandgap greater than that of the active layer 16 but less than that of the beam waveguide 32 in the separator region B. This process results as shown in FIG. 7b.

Figure 8A:
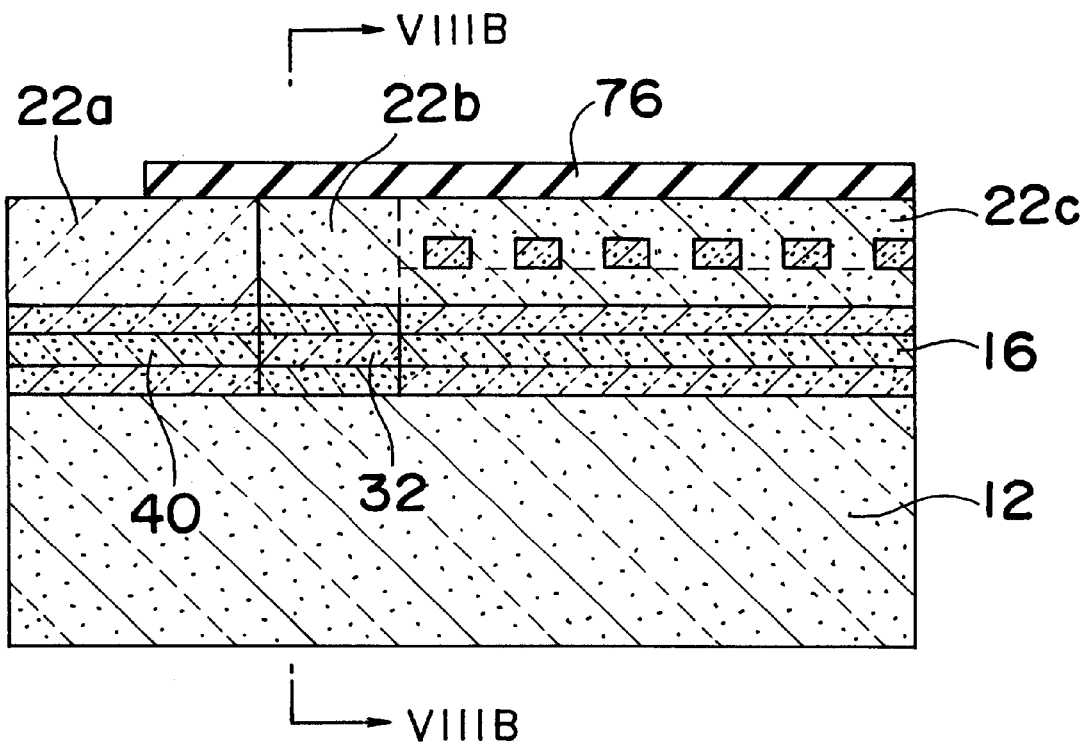
Figure 8B:
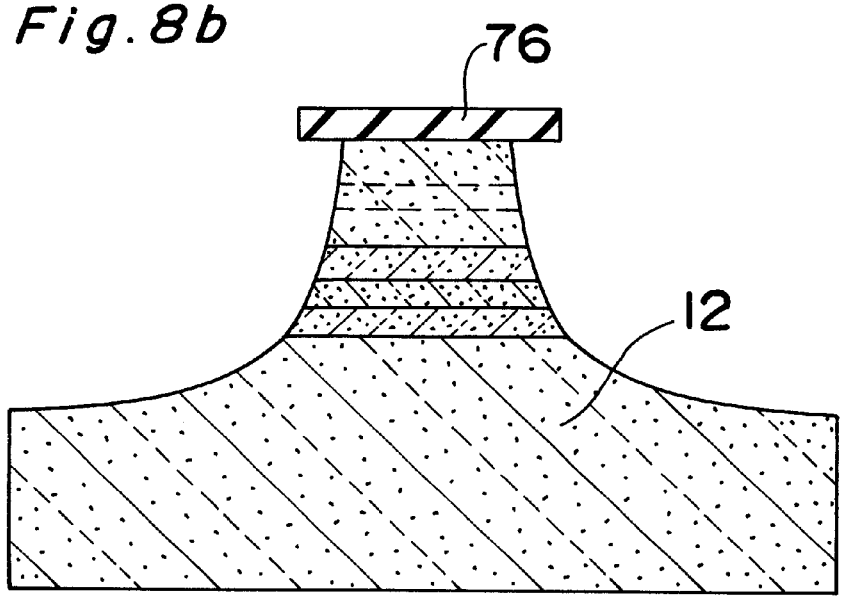

Next as shown in FIGS. 8a and 8b, the dielectric layer 74 is removed, again an another dielectric layer of material such as $SiO_2$ and SiN is deposited on the p-InP layer of the first clad layer 22 (i.e. 22a, 22b, and 22c), a stripe-shaped dielectric layer 76 is formed to form the laser waveguide 20 with the active layer 20, the separator region waveguide 36 with the beam waveguide 32, and the modulator region waveguide 44 with the beam absorption layer 40 (FIG. 8a. The entire layers are wet-etched with HBr using a mask of this dielectric layer 76 until the substrate 12 is exposed so that a ridge as a waveguide is shaped. The layers at the end adjacent to the emitting surface, as well as on the both sides of the ridge is also etched until the substrate 12 is exposed. This step results as shown in FIG. 8b, 9 sectional view taken along lines VIIIB—VIIB of the FIG. 8a.

Figure 9A:
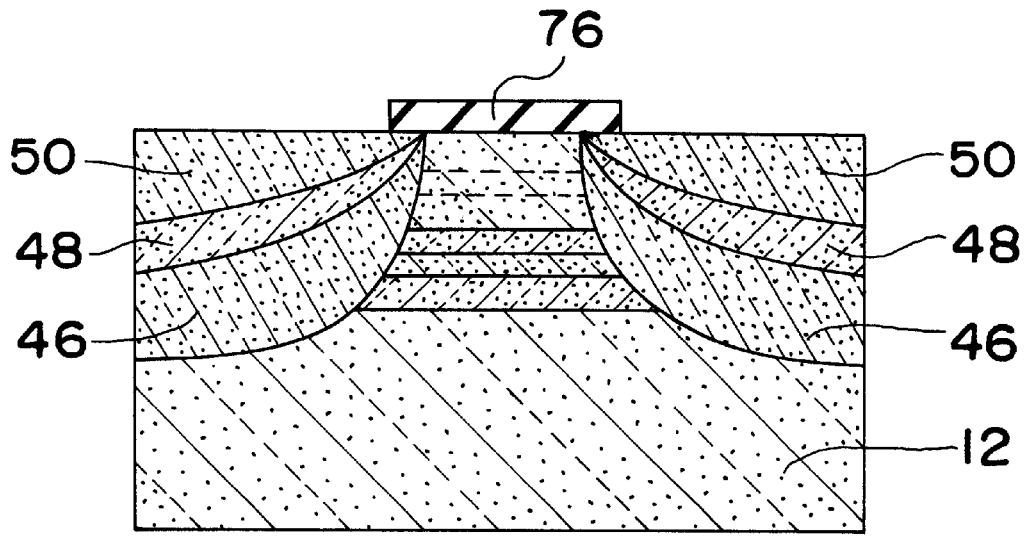

Next, while retaining the stripe-shaped dielectric layer 76 as a mask, the InP layer doped with Fe for the first embedded layer 46, the n-InP layer of the Hall-trap layer 48, and the InP layer doped with Fe for the second embedded layer 50 are deposited in sequence by the MOCVD method. This step results as shown in FIG. 9a, which is a sectional view taken along lines VIIIB—VIIIB of FIG. 8a.

Figure 9B:
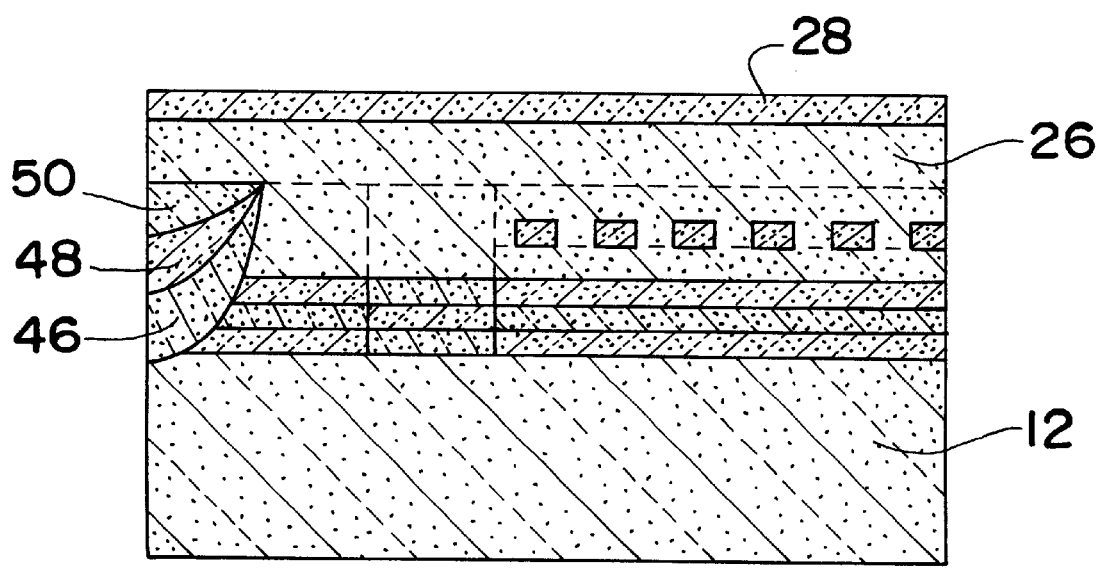

Next, a p-InP layer of the second clad layer 26 and a $p^+$-InGaAs layer of the contact layer 28 are grown by the MOCVD method entirely on the surface of the first clad layer 22 and the second embedded layer 50. This step results as shown in FIG. 9b.

Figure 10:
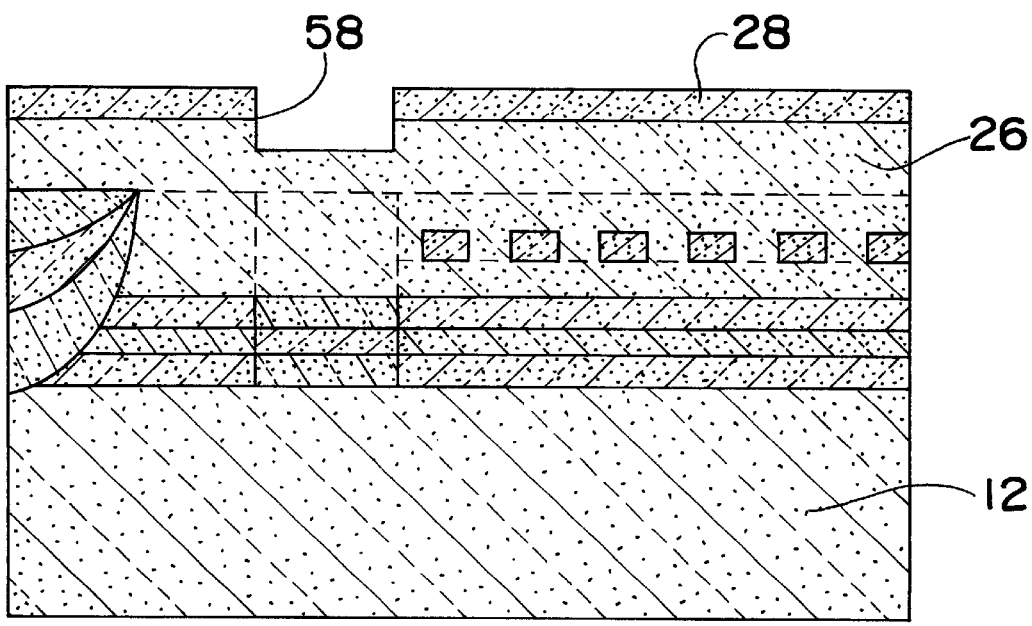

Next, the contact layer 28 and a part of the second clad layer 26 corresponding to the separator region B are etched away to form a separator groove 58. In this step, the tartaric acid solution is used for etching the contact layer 28 of the $p^+$-InGaAs layer, and the hydrochloric acid is used for etching the second clad layer 26 of the p-InP layer. This step results as shown in FIG. 10.

An insulator layer 56 of material such as $SiO_2$ is deposited by spattering entirely atop the surface including the surface of the separator groove 58, and then etched away to form apertures at electrode contact portions. A evaporated electrode surfaces 60 of Ti/Au are formed on the contact portions on which Au-coated layers are deposited to form a p-side laser electrode 62 and a p-side modulator electrode 64.

A backside of the substrate is thinned until the substrate is approximately 100 micrometer thick. Layers of AuGe/Ni/Ti/Pt/Ti/Pt/Au in sequence are deposited on the backside of the substrate to form an evaporated electrode 66, and a common electrode 68 of a Au-coated layer is deposited thereon thereby completing a modular-integrated semiconductor laser device 10.

The aforementioned manufacturing steps are described, for the case of growing bulk crystal by a butt-joint method when forming the separator region waveguide 36 and the modulator region waveguide 44. However both of the beam waveguide layer 32 and the beam absorption layer 40 may be formed by using the butt-joint method twice for composing both waveguides with the MQW structure.

According to the butt-joint method, since the material of each of and the layer structure of the laser region C, the separator region B, and modulator region A can be chosen so that a high design flexibility is permitted. Therefore any structure of the laser region C, the separator region B, and the modulator region A, can be formed with refractive index and bandgap which are appropriate for each of the above regions.

Figure 11:
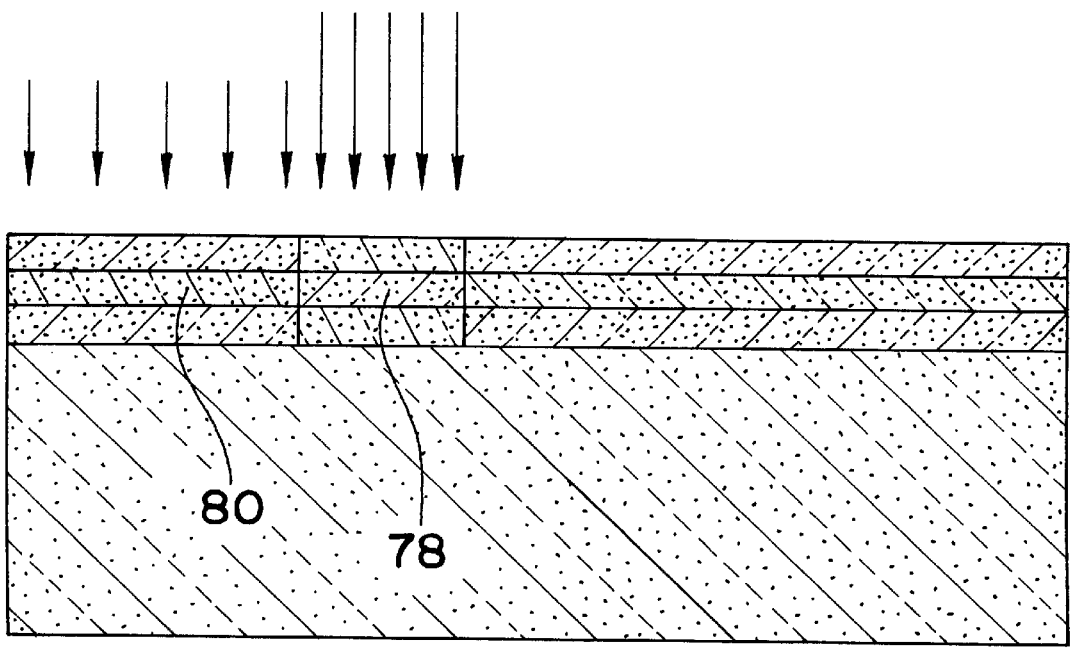
FIG. 11 is a sectional view of the modulator-integrated semiconductor laser device according to the present invention showing the step of ion implanting.

After the step shown FIG. 5a, while retaining the stripe-shaped dielectric layer 72, the beam waveguide layer 32 can be formed of the MQW layer of InGaAsP by the MOCVD method with bandgap of the beam waveguide layer 32 greater than that of the beam absorption layer 40 by ion-implanting thereby changing the compositional disordering ratio of the beam waveguide 32 in the separator region B and the beam absorption layer 40 in the modulator region A. FIG. 11 is a sectional view of the device showing the step of the ion-implanting, wherein the length of arrows denotes the amount of dose.

In FIG. 11, numeral 78 denotes a beam waveguide layer and numeral 80 denotes the beam absorption layer, each layer has the MQW structure compositionally disordered by ion-implanting.

In this case, the active layer 16 and the beam waveguide layer 78 are connected together in a way of the butt-joint, and the beam waveguide layer 78 and beam absorption layer 80 compose so-called a bulk-like structure. Ion sources such as Si, Zn, and Ga are available for the MQW layer of InGaAsP, and Si, Zn, Ga, Al, or the like are available as ion sources for the MQW layer of InGaAlAs.

Figure 12:
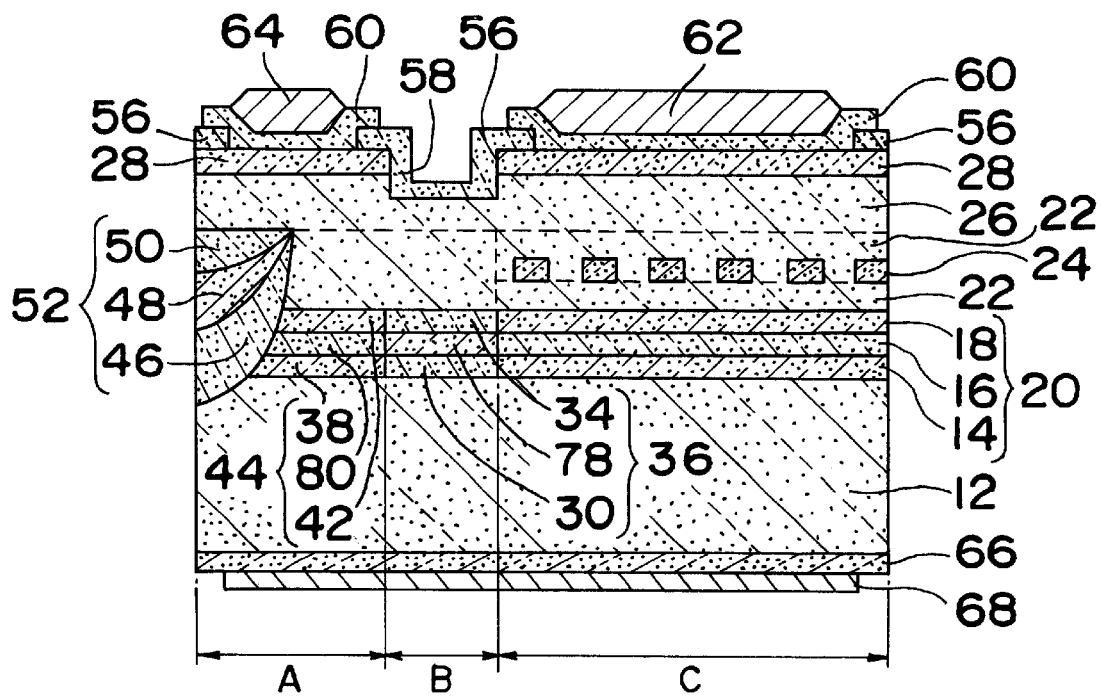
FIGS. 12 through 15 are sectional views of the modulator-integrated semiconductor laser device according to the present invention.

FIG. 12 is a sectional view of the device that is formed by varying the compositional disordering ratio of the ion-implanting. The structure of FIG. 12 is the same as that of FIG. 2 with an exception of that the beam waveguide layer 78 in the separator region B and the beam absorption layer 80 in the modulator region A are different.

After growing the MQW active layer 16 in FIG. 4a or 4b, the beam absorption layer 40 may be formed with material of bandgap less than that of the beam waveguide layer 32 by varying the compositional disordering ratio by ion-implanting. In this case, the butt-joint is not adopted.

Next, the operation of the modulator-integrated semiconductor laser device according to the present invention is described hereinafter.

The forward voltage are applied between the laser electrode 62 and the common electrode 68 to inject the current into the active layer 16, so that the laser beam is emitted in the laser region C and guided through the separator waveguide 36 into the modulator waveguide 44.

Meanwhile the modulating signals of reverse-biased voltage are applied between the modulator electrode 64 and the common electrode 68 to apply the beam absorption layer 40 with the electric field corresponding to the modulating signals, so that the laser beam 70 can be modulated at high frequency to emit. Therefore since the beam absorption layer 40 composes a bulk crystal structure or a compositionally disordered bulk-like structure, the modulating principle is not based upon the Stark quantum confinement effect but the Franz-Keldysh effect.

The Franz-Keldysh effect causes a little fluctuation of the beam absorption rate due to the electric field, thereby causing a little fluctuation of the refractive index. Therefore by using the bulk-type modulator, the fluctuation of the wavelength can be also suppressed because of the suppressed fluctuation of the refractive index, thus it is advantageous to transmit the beam in long distance.

Further since the beam absorption layer 32 in the separator region B is composed of a bulk crystal structure or a compositionally disordered bulk-like structure, the Franz-Keldysh effect causes a little fluctuation of the beam absorption rate due to the electric field, so that the fluctuation of the beam absorption rate can be suppressed even if the leakage electric field is applied to the beam waveguide layer 32 in the separator region B. Especially, as the beam waveguide layer 32 in the separator region B responds only to the electric field of low frequency (several GHz), the frequency-characteristics would not be flat when the amount of the beam absorption changes, however the aberration of the frequency-characteristics can be reduced by composing the beam waveguide layer 32 of the bulk structure.

Also the beam waveguide layer 32 and the beam absorption layer 40 are formed by re-crystallizing with the butt-joint method to compose the bulk-structure, so that the modulator-integrated semiconductor laser device can be realized, which absorb the beam little due to small amount of the non-radiative recombination center.

In the above-mentioned structure, the diffractive grating is provided in the side of the p-InP layer, however it may be provided in the side of the substrate.

Figure 13:
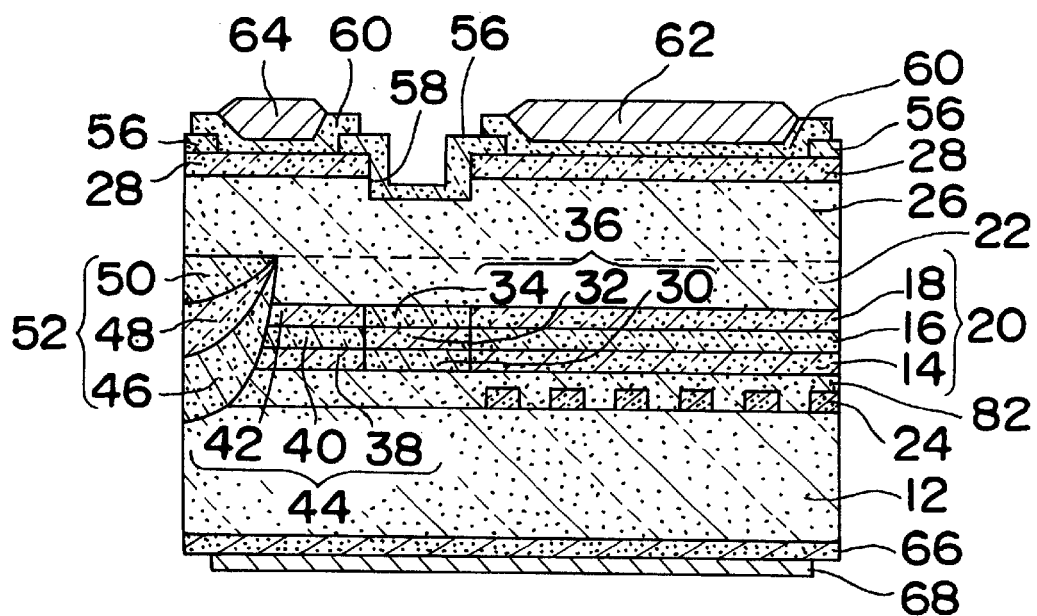

FIG. 13 is a sectional view of a modification of the embodiment 1.

In FIG. 13, the diffractive grating 24 is embedded in a third clad layer 82 of n-InP, which is sandwiched between the substrate 12 on the one hand, and the laser n-side beam confinement layer 14, the separator region n-side beam confinement layer 30, and the modulator region n-side beam confinement layer 38 on the other hand.

Figure 14:
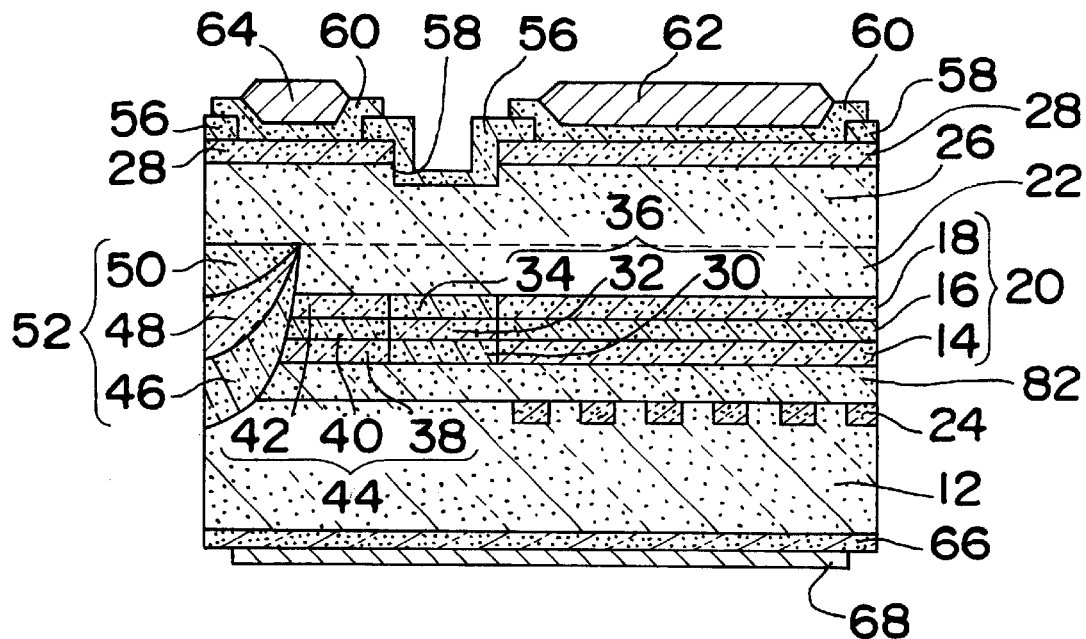

FIG. 14 is a sectional view of an another modification of the embodiment 1.

In FIG. 14, the diffractive grating 24 is formed and embedded in the substrate 12, a third clad layer 82 of n-InP is then deposited thereon, over which the laser n-side beam confinement layer 14, the separator region n-side beam confinement layer 30, and the modulator region n-side beam confinement layer 38 are deposited.

(Embodiment 2)

According to the embodiment 2, when simultaneously re-growing the separator region waveguide 36 and the modulator region waveguide 44 by the butt-joint method, the separator region waveguide 36 with the beam waveguide layer 32 and the modulator region waveguide 44 with the beam absorption layer 40 are formed to have different thickness to form the beam absorption layer 40 of bandgap greater than that of the active layer 16, and also to form the beam waveguide layer 32 of bandgap further greater than that of the beam absorption layer 40.

EXAMPLE 1

Figure 15:
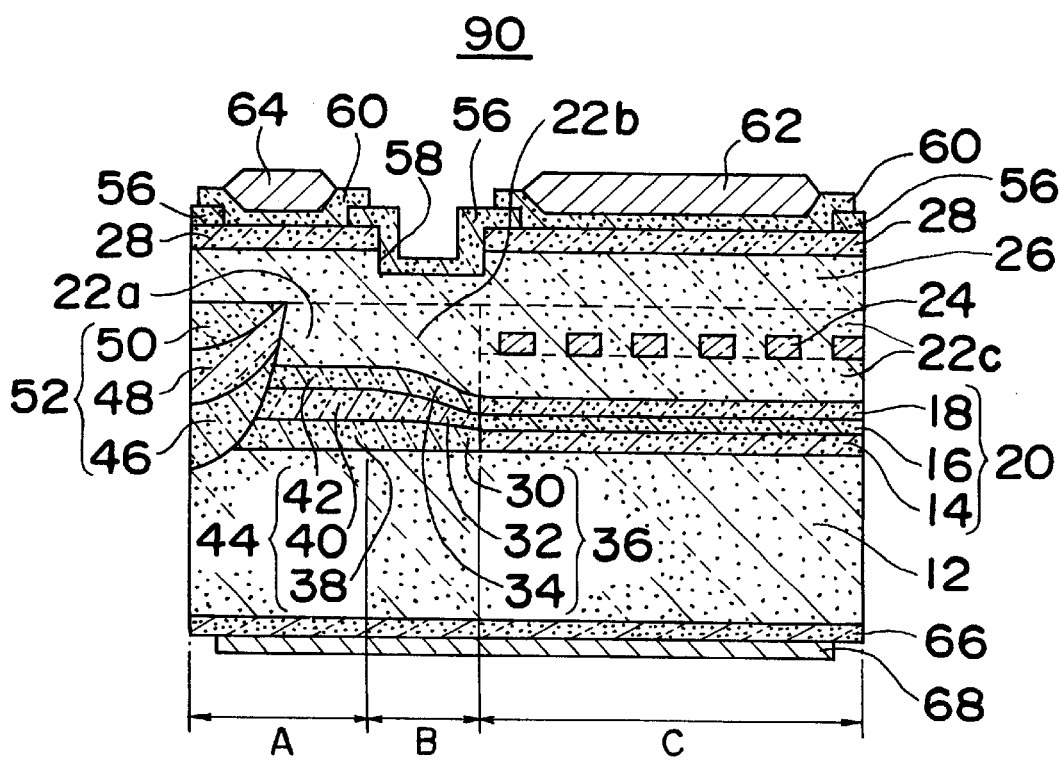

FIG. 15 is a sectional view of the modulator-integrated semiconductor laser device of the example 1 according to the embodiment 2.

In FIG. 15, numeral 90 denotes a modulator-integrated semiconductor laser device. The same reference number as FIG. 2 denoted same or similar parts.

According to the modulator-integrated semiconductor laser device 90, the separator region waveguide 36 and the modulator region waveguide 44 comprises three pairs of layers, i.e., the separation region n-side beam confinement layer 30 and the modulator region n-side beam confinement layer 38, the beam waveguide layer 32 and the beam absorption layer 40, and the separation region p-side beam confinement layer 34 and the modulator region n-side beam confinement layer 42. And each pair of layers are simultaneously formed by the selective growth to compose the bulk crystal structure.

Each layer of the separator region waveguide 36 has thickness that is thinner toward the laser waveguide 20 and thicker toward the modulator region waveguide 44. Each pair of layers of the separator region waveguide 36 and the laser waveguide 20 have the same thickness at the re-growth interface of the composition face, and are connected to one another.

Now, a process for manufacturing the modulator-integrated semiconductor laser device 90 according to the embodiment 2 is described hereinafter.

Figure 16:
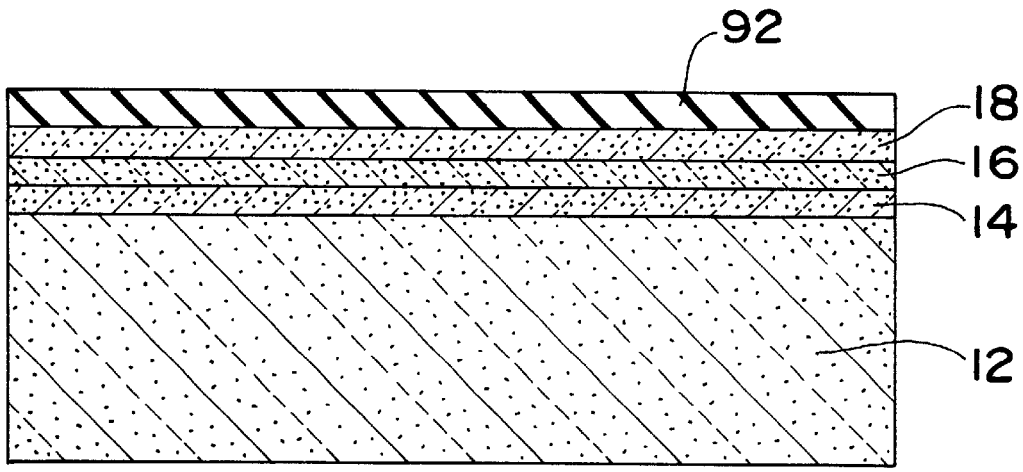
FIG. 16 is a sectional view of the modulator-integrated semiconductor laser device according to the present invention showing the manufacturing steps thereof.
Figure 17:
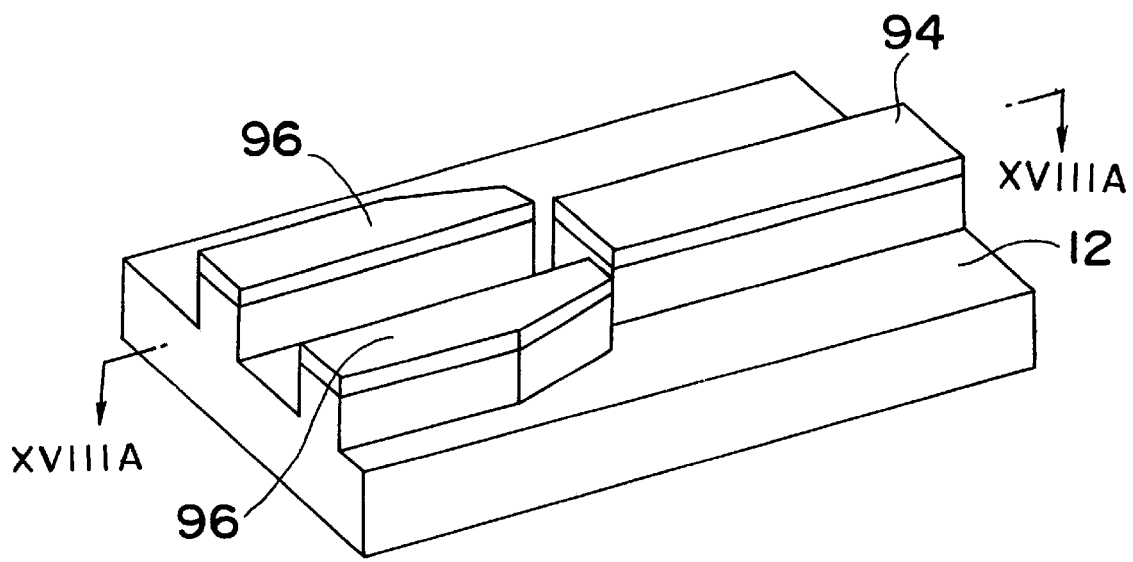
FIG. 17 is a perspective view of the modulator-integrated semiconductor laser device according to the present invention showing one of the manufacturing steps thereof.

FIGS. 16 and 18 are sectional views of the device showing each step, and FIG. 17 is a perspective view of the device showing one of the steps.

In FIG. 16, first as shown in FIG. 16, on the substrate 12 of n-InP formed by a MOCVD method are in sequence, an n-InGaAsP layer of the n-side laser beam confinement layer 14, a MQW InGaAsP layer of the active layer, a p-InGaAsP layer of the p-side laser beam confinement layer 18. Also a insulator layer 92 of material such as $SiO_2$ and SiN is deposited thereon. This step results as shown in FIG. 16.

In FIG. 17, this insulator layer 92 is etched in a photolithography step and the etching step to form an stripe-shaped insulator for forming the laser waveguide 20, and a pair of trapezoid-shaped insulator layers 96 defining a stripe-shaped space between them on the side of the laser emitting end surface and extending on the both sides of the striped-shape space in the direction longitudinal to the stripe-shaped space.

As shown in FIG. 17, each of the trapezoid-shaped insulator layer 96 has width which is narrower towards to the insulator layer 94 and wider away from the insulator layer 94 and constant from the predetermined position. The region varying the width corresponds to the separator region waveguide 36.

The layers are etched using the insulator layer 94 and 96 as the mask, until the substrate 12 is exposed. This step results as shown in FIG. 17.

Figure 18A:
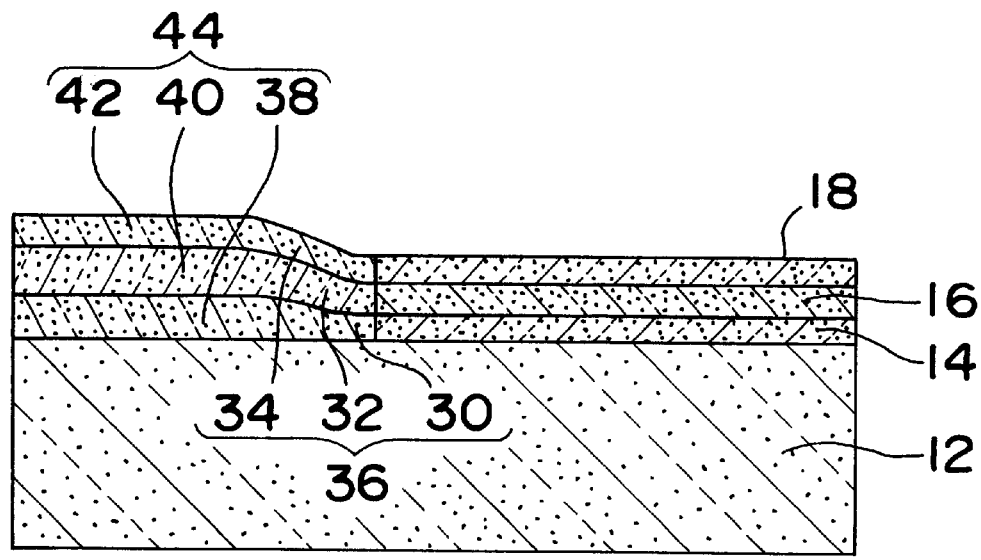
FIGS. 18a and 18b are sectional views of the modulator-integrated semiconductor laser device according to the present invention showing the manufacturing steps thereof.

Next, while retaining the insulator layer 94 and 96, deposited by the selective growth with the MOCVD method are in sequence, an n-InGaAsP layer of the separator region n-side beam confinement layer 30 and the modulator region n-side beam confinement layer 38, an InGaAsP layer of both of the beam waveguide layer 32 and: the beam absorption layer 40, and a p-InGaAsP layer of the separator region p-side beam confinement layer 34 and modulator region p-side beam confinement layer 42. In the stripe-shaped space between the pair of the insulator layers 94 and 96, layers in the separator region and the modulator region are deposited by the selective growth so that each of the layers in the separator region is thicker as the insulator layers 96 are wider, while layers in the modulator region have constant thickness as the insulator layers 96 is evenly thick. This step results as shown in FIG. 18a, is a sectional view taken along lines XVIIA—XVIIA of FIG. 17.

Figure 18B:
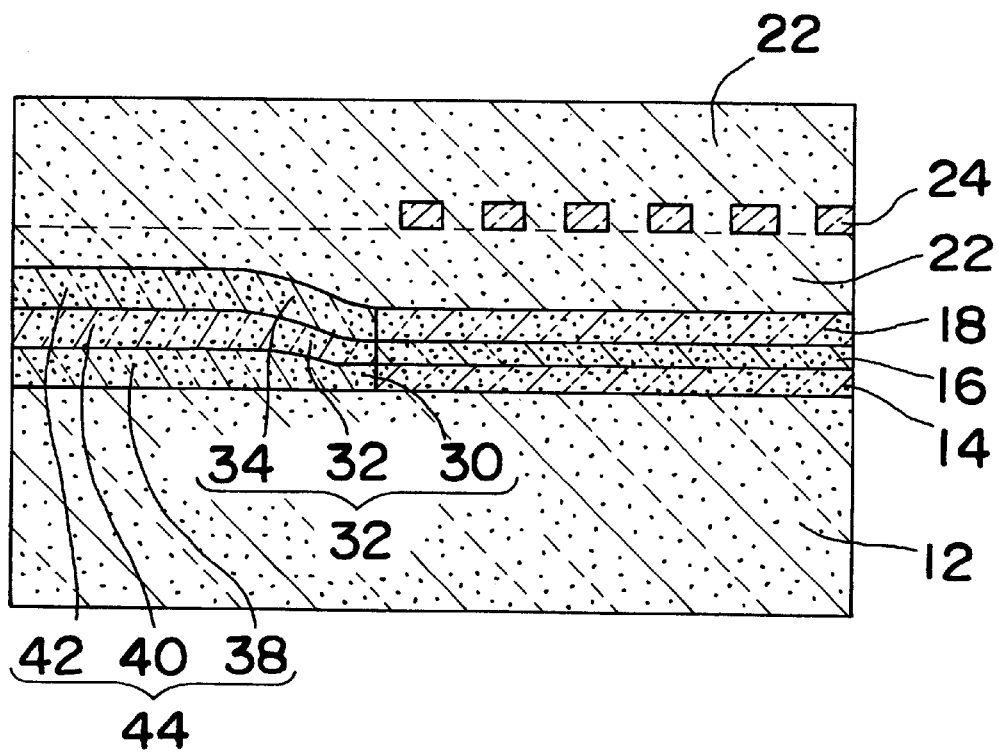

Next, the insulator layers 94 and 96 are removed, a p-InP layer of the first clad layer 22 is formed atop the p-side laser beam confinement layer 18, the separator region p-side beam confinement layer 34, and the modulator region p-side beam confinement layer 42. Further a diffractive grating is formed in the laser region C and embedded within the p-InP layer of the first clad layer 22. This step results as shown in FIG. 18b.

Next, the ridge of the waveguide is formed. The device is manufactured thereafter in the steps as described in the embodiment 1.

(Modification of Embodiment 1 of the Manufacturing Process)

An another modification of embodiment 1 is described for manufacturing the separator region waveguide 36 and the modulator region waveguide 44 by the selective growth with the butt-joint method.

Figure 19:
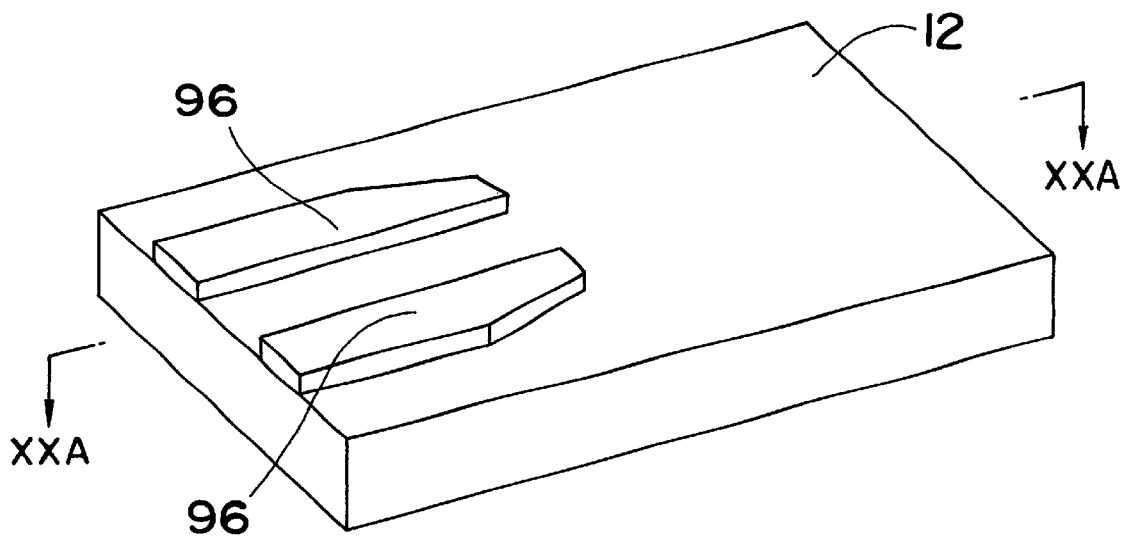
FIG. 19 is a perspective view of the modulator-integrated semiconductor laser device according to the present invention showing one of the manufacturing steps thereof.
Figure 20A:
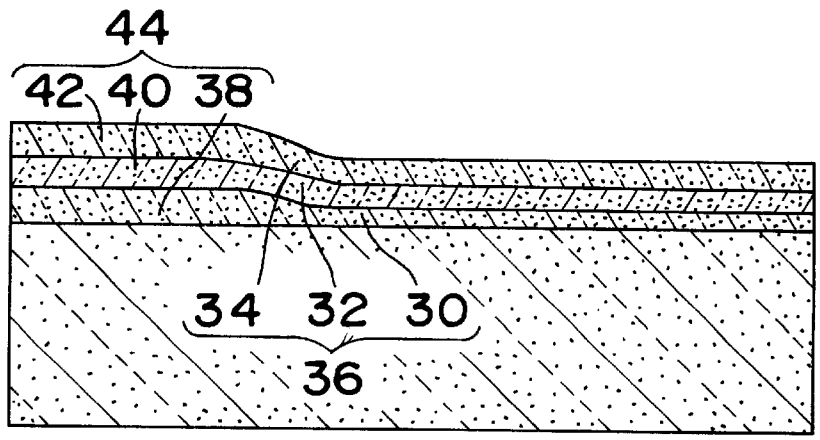
FIGS. 20a–20c are sectional views of the modulator-integrated semiconductor laser device according to the present invention showing the manufacturing steps thereof.
Figure 20B:
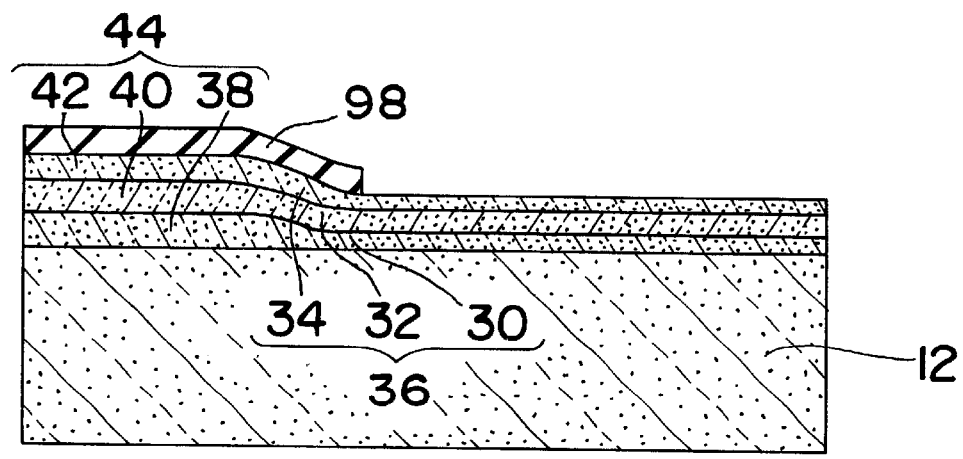
Figure 20C:
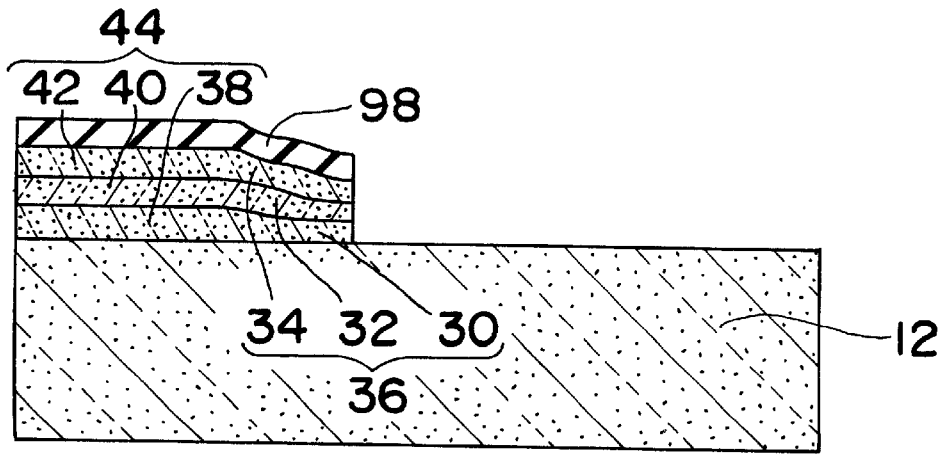
Figure 21:
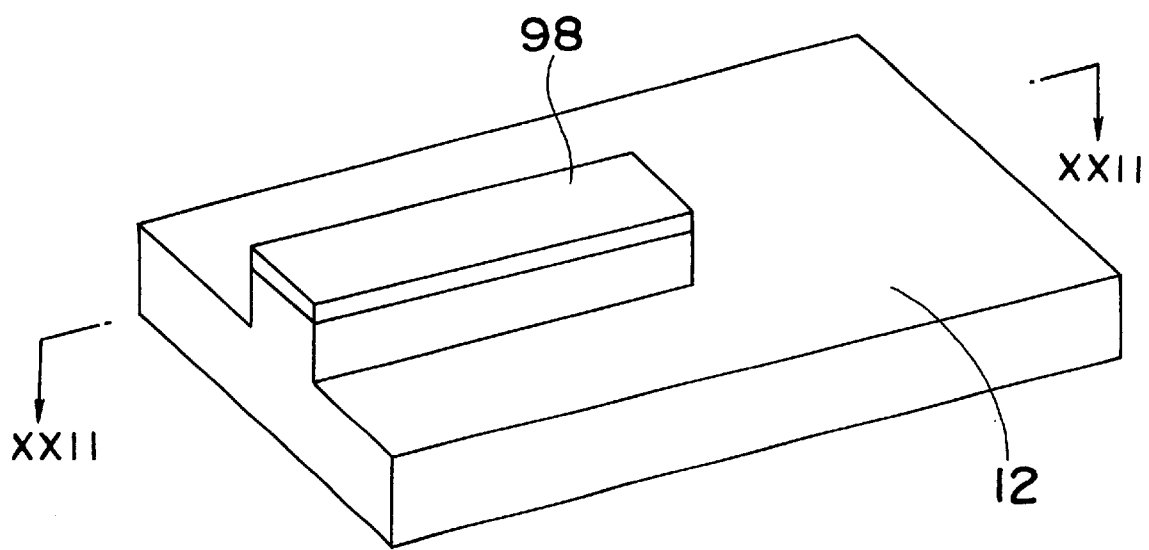
FIG. 21 is a perspective view of the modulator-integrated semiconductor laser device according to the present invention showing one of the manufacturing steps thereof.

FIGS. 19 and 21 are perspective views of the device showing one of steps, and FIGS. 20a, 20c, 22a, and 22b are sectional views of the device showing the manufacturing steps.

In FIG. 19, a selective growth mask is deposited to form the separator region waveguide 36 and the modulator region waveguide 44 on the substrate 12. Thus a pair of trapezoid-shaped insulator layers 96 are formed and etched in a photolithography step and the etching step, which defines a stripe-shaped space between them corresponding to the waveguide shape in the separator region waveguide and the modulator region waveguide on the side of the laser emitting end surface. The pair of trapezoid-shaped insulator layers 96 extends on the both sides of the striped-shape space in the direction longitudinal to the stripe-shaped space. As shown in FIG. 19, each of the trapezoid-shaped insulator layers 96 has a width which is narrower inside and wider outward, and constant in a certain region. The region with the varying width corresponds to the separator region waveguide 36. This step results as shown in FIG. 19.

In FIG. 20a, deposited by a MOCVD method with the insulator layer 96 as the selective growth mask are in sequence, an n-InGaAsP layer of the separator region n-side beam confinement layer 30 and the modulator region n-side beam confinement layer 38, an InGaAsP layer of the beam waveguide layer 32 and the beam absorption layer 40, and a p-InGaAsP layer of the separator region p-side beam confinement layer 34 and modulator region p-side beam confinement layer 42.

In the stripe-shaped space between the pair of the insulator layers 96, layers in the separator region and the modulator region are deposited by selective growth so that the layers in the modulator region adjacent to the beam emitting surface have constant thickness as the width of the insulator 96 is constant, and the layers become thinner as the insulator 96 is narrower inwardly. This step results as shown in FIG. 20a.

Next, the insulator 96 is removed, again an another insulator layer is deposited and etched in a photolithography step and the etching step to form a stripe-shaped insulator layer 98 on layers in the stripe-shaped space sandwiched by the pair of the insulator layers 96. The stripe-shaped insulator layer 98 has the width less than that of the layers beneath the space, and the same length as the insulator layer 96 (FIG. 20b). And while retaining the insulator layer 98 as a mask, the separator region waveguide 36 and the modulator region waveguide 44 are formed and etched until the substrate 12 is exposed. FIG. 20c shows the result of the step, and the FIG. 21 shows a perspective view of the device in this step.

Figure 22A:
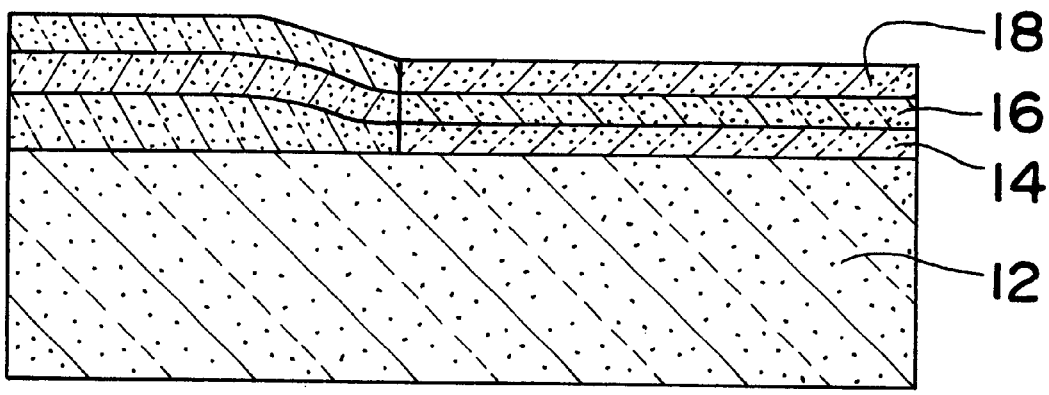
FIGS. 22a and 22b are sectional views of the modulator-integrated semiconductor laser device according to the present invention showing the manufacturing steps thereof.

Next, while retaining the insulator layer 98 as a mask, on the substrate 12 formed by a MOCVD method are in sequence, an n-InGaAsP layer of the n-side laser beam confinement layer 14, a MQW InGaAsP layer of the active layer 16, a p-InGaAsP layer of the p-side laser beam confinement layer 18. This step results as shown in FIG. 22a.

Figure 22B:
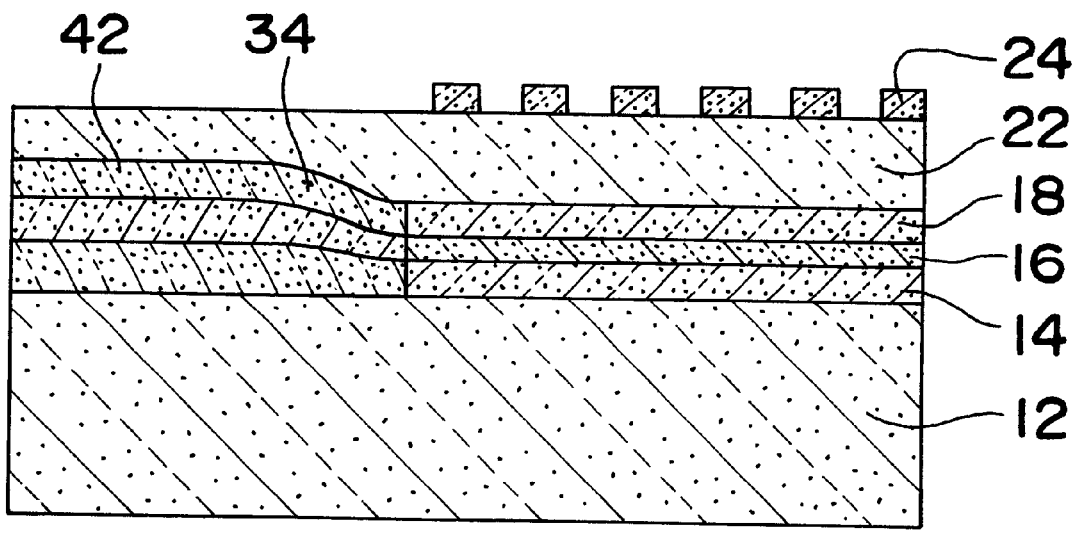

Next, the insulator layer 98 is removed, a p-InP layer of the first clad layer 22 is formed atop the separator region p-side beam confinement layer 34, the modulator region p-side beam confinement layer 42, and the p-side laser beam confinement layer 18. Further a diffractive grating 24 is formed in the laser region C corresponding to the active layer. This step results as shown in FIGS. 22a and 22b are sectional views taken along lines XXII—XXII of FIG. 21.

Next, the diffractive grating is embedded within the first clad layer 22 and the ridge of the waveguide is formed. The device is manufactured thereafter in the steps described in the embodiment 1.

EXAMPLE 2

Figure 23:
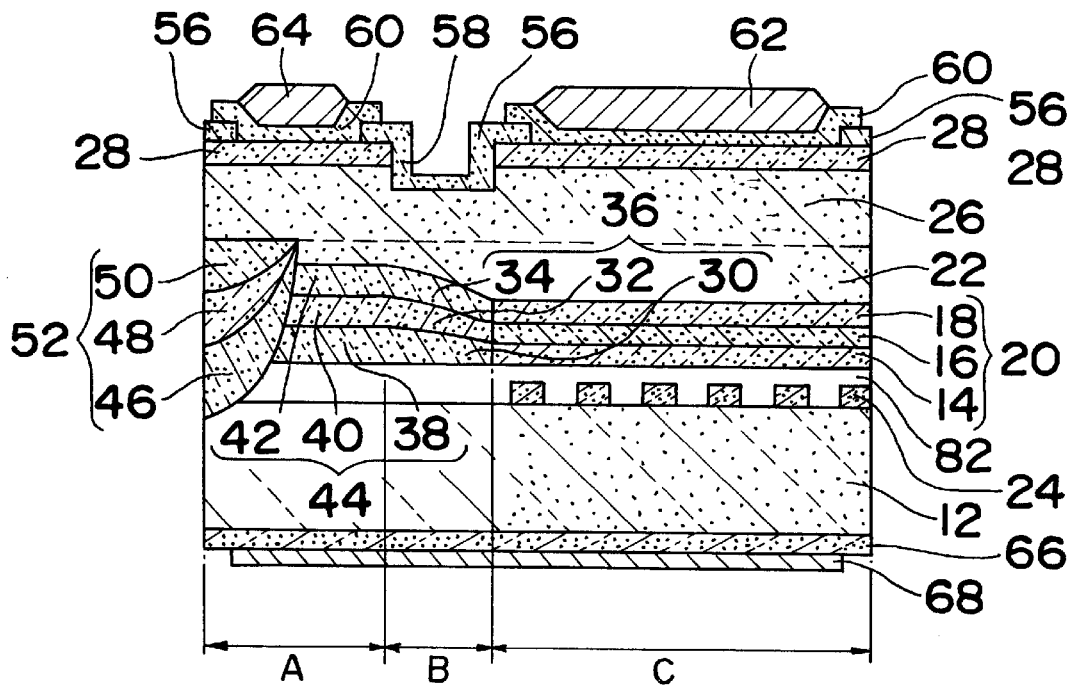
FIG. 23 and FIG. 24 are sectional views of the modulator-integrated semiconductor laser device according to the present invention.

As described above for the embodiment 2, the diffractive grating 24 is formed in the side of the p-InP layer but can be formed in the n-InP layer in the side of the substrate. FIG. 23 is a sectional view of the example 2 according to the embodiment 2.

In FIG. 23, the diffractive grating 24 is embedded within the third clad layer 82 of n-InP which is sandwiched between the substrate 12 on the one hand, and the laser n-side beam confinement layer 14, the separator region n-side beam confinement layer 30, and the modulator region n-side beam confinement layer 38 on the other hand.

Figure 24:
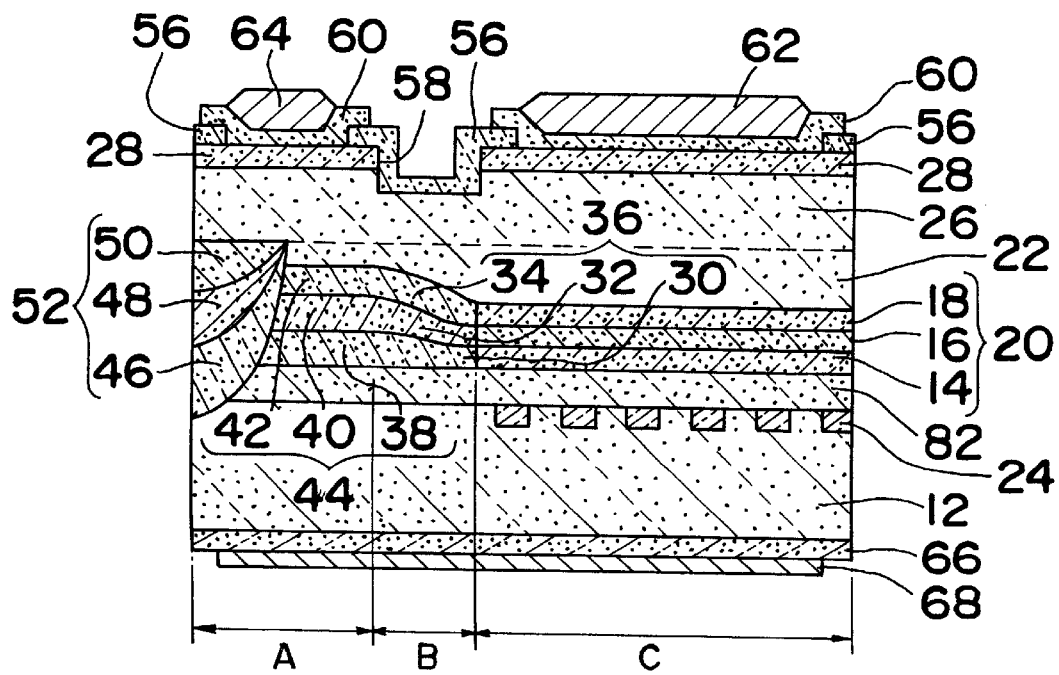

FIG. 24 is a sectional view of showing an another modification of the example 2.

In FIG. 24, the diffractive grating 24 is embedded within the substrate 12 and the third clad layer 82 of n-InP is deposited thereon. And the laser n-side beam confinement layer 14, the separator region n-side beam confinement layer 30, and the modulator region n-side beam confinement layer 38 is deposited on the third clad layer 82.

A manufacturing process of the embodiment 2 shown in FIG. 23 will be described hereinafter.

FIG. 25 is a sectional view of the device showing the manufacturing steps.

Figure 25A:
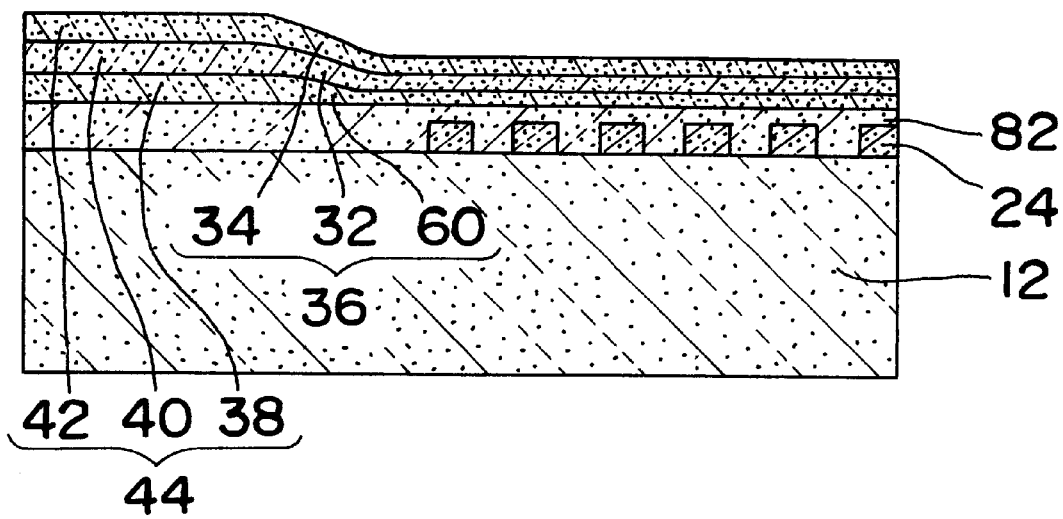
FIGS. 25a through 26b are sectional views of the modulator-integrated semiconductor laser device according to the present invention showing the manufacturing steps thereof.

First in FIG. 25a, the diffractive grating 24 is embedded in the n-InP layer of the third clad layer 82 on the side of the laser waveguide 20. The device is manufactured thereafter in the same steps as described for the modification of the embodiment 1. Deposited by a MOCVD method with the selective growth mask are in sequence, an n-InGaAsP layer of both of the separator region n-side beam confinement layer 30 and the modulator region n-side beam confinement layer 38, an InGaAsP layer of both of the beam waveguide layer 32 and the beam absorption layer 40, and a p-InGaAsP layer of both of the separator region p-side beam confinement layer 34 and modulator region p-side beam confinement layer 42. This step results in the structure shown in FIG. 25a.

Figure 25B:
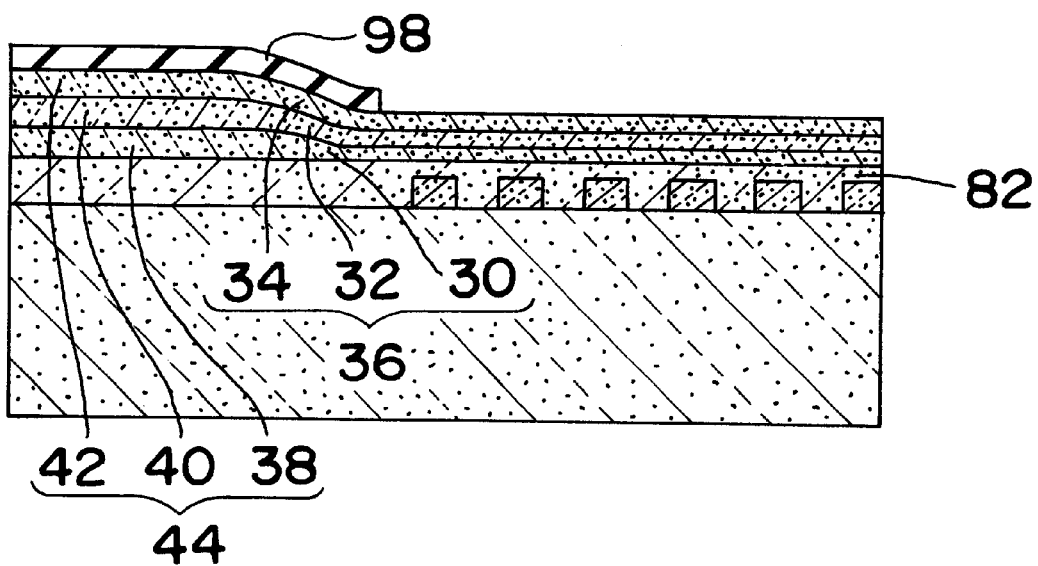
Figure 26A:
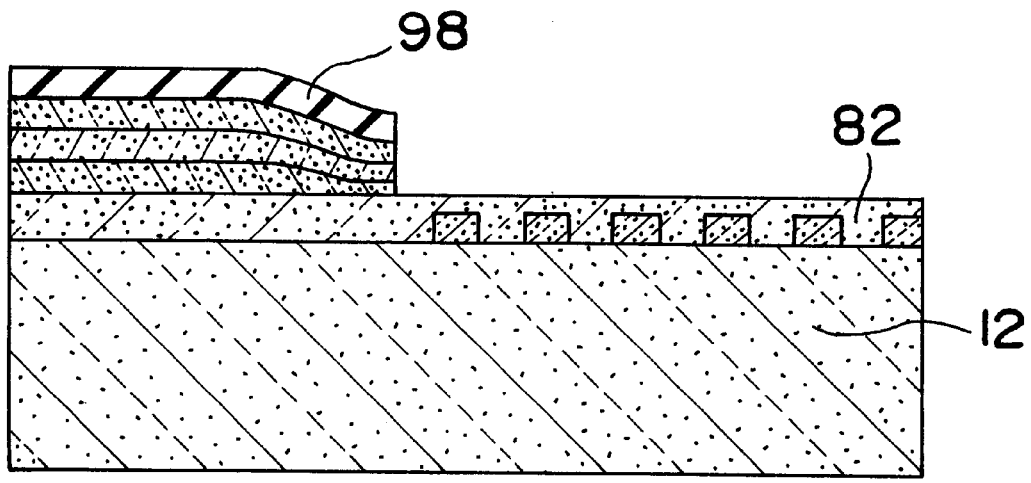

Next, the insulator 96 is removed, again an another insulator layer is deposited and etched in a photolithography step and the etching step to form a stripe-shaped insulator layer 98 on layers in the stripe-shaped space sandwiched by the pair of the insulator layers 96 which has the width less than that of the layers beneath the space and the same length as the insulator layer 96 (FIG. 25b). And while retaining the insulator layer 98 as a mask, the separator region waveguide 36 and the modulator region waveguide 44 are formed and etched until the n-InP layer of the third clad layer 82 is exposed in the case of example 2 because the diffractive grating is formed on the substrate 12, on the contrary, which would be etched until the surface of the substrate is exposed in case of the modification of the example 1 (FIG. 26a).

Next, while retaining the insulator layer 98 as a mask, on the n-InP layer of the third clad layer 82 formed by a MOCVD method are in sequence, an n-InGaAsP layer of the n-side laser beam confinement layer 14, a MQW InGaAsP layer of the active layer 16, a p-InGaAsP layer of the p-side laser beam confinement layer 18.

Figure 26B:
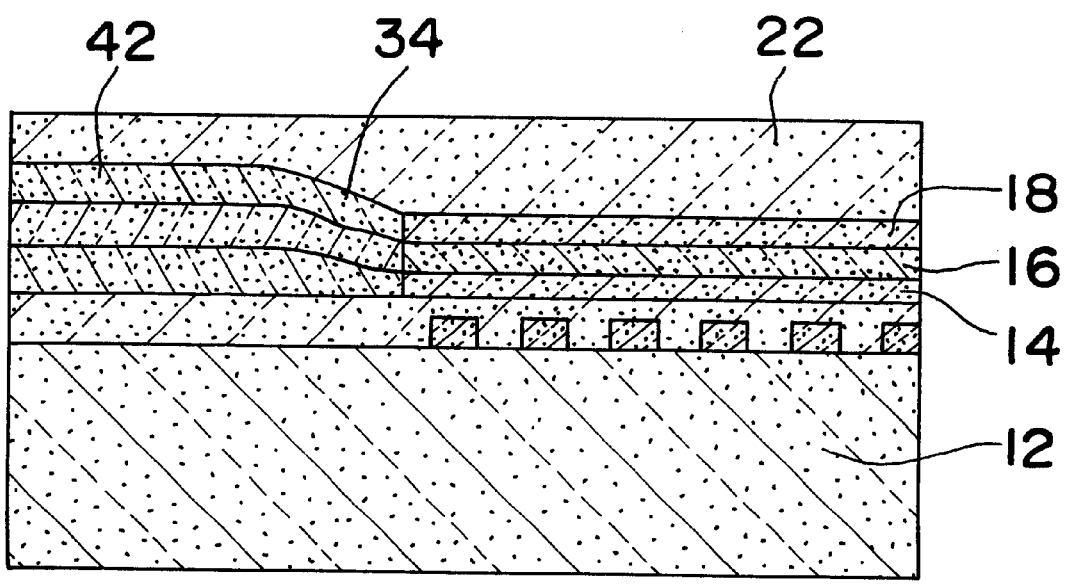
Figure 27:
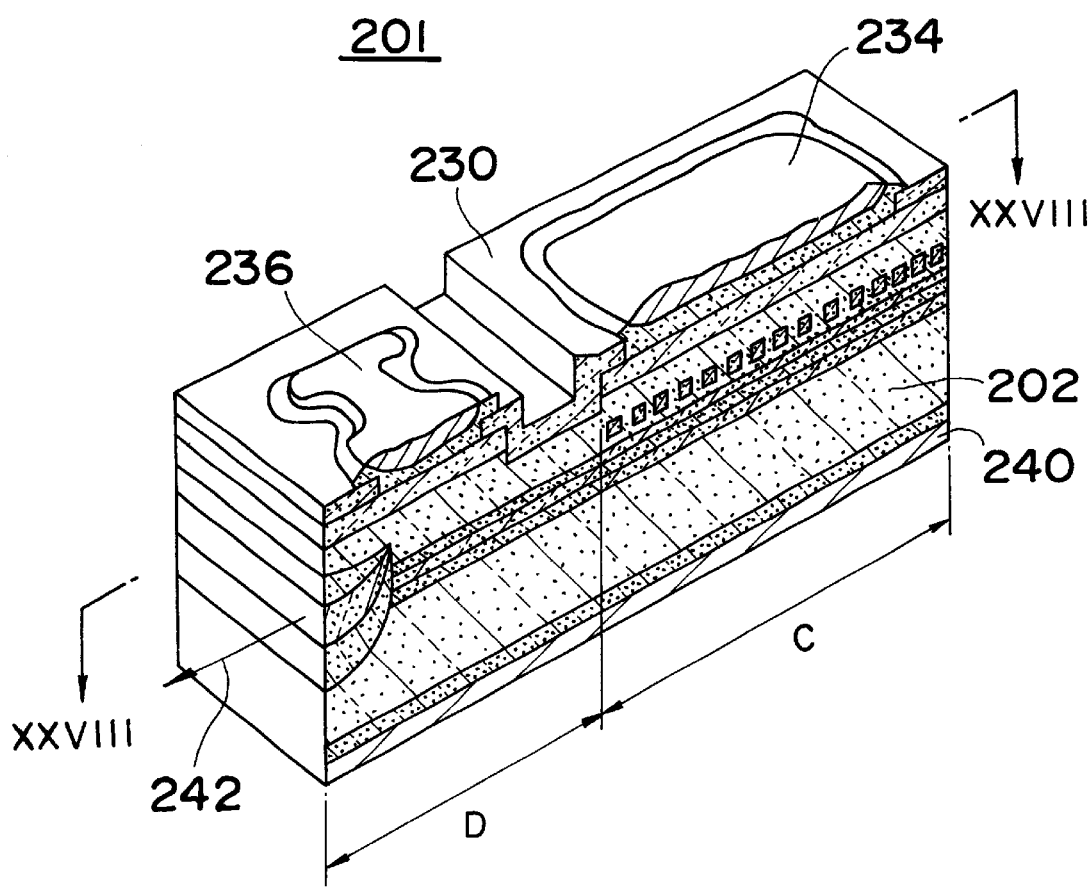
FIG. 27 is a partially sectional perspective view of the modulator-integrated semiconductor laser device according to the prior arts.
Figure 28:
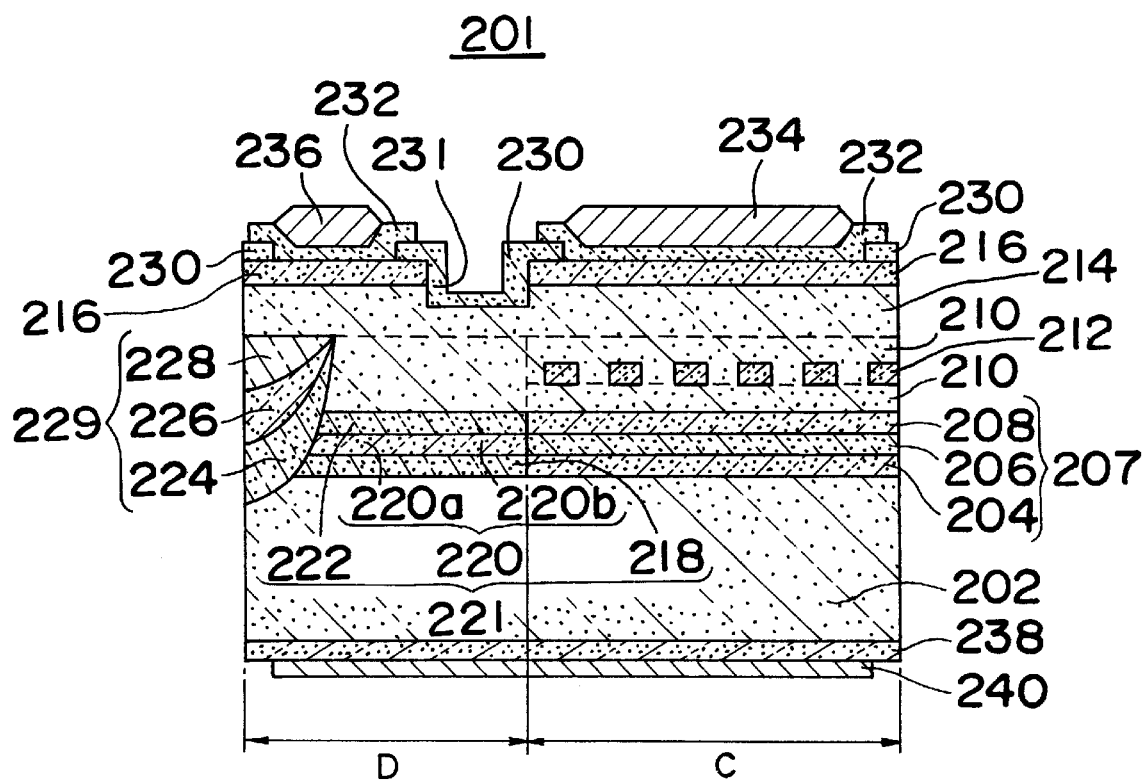
FIG. 28 is a sectional view taken along lines XXVIII—XXVIII of the FIG. 27.

Next, the insulator layer 98 is removed, a p-InP layer of the first clad layer 22 is formed atop the surface of the separator region p-side beam confinement layer 34, the modulator region p-side beam confinement layer 42, and the p-side laser beam confinement layer 18 (FIG. 26b). The device is manufactured thereafter in the same steps as described for the embodiment 1.

According to the modular-integrated semiconductor laser device manufactured as described above, the separator region waveguide 36 and the modulator region waveguide 44 are simultaneously re-grown by the butt-joint method, so that the beam waveguide layer 32 and the beam absorption layer 40 are formed of the bulk-structure. Therefore a modulator can suppress the fluctuation of the absorption ratio due to the electric field thereby minimizing the fluctuation of the refractive ratio due to the small fluctuation of the absorption ratio. Therefore the device can advantageously transmit the beam in long distance. Further since the beam waveguide layer 32 in the separator region B is composed of a bulk crystal structure, the fluctuation of the beam absorption rate can be reduced due to the electric field, so that, even if the leakage electric field is applied, the fluctuation of the beam absorption rate can be suppressed thereby avoiding the aberration of the frequency-characteristics in low frequency (several GHz).

While simultaneously forming the separator region waveguide 36 and the modulator region waveguide 44 by the selective growth, the thickness of layers of the separator waveguide 36 are thinner towards the laser waveguide 20 and thicker towards the modulator region waveguide 44 so that the bandgap of the beam waveguide layer 32 is greater than that of the beam absorption layer 40 thereby reducing the beam absorption rate and the fluctuation of the frequency.

Further since layers of the separator region waveguide 36 and the modulator region waveguide 44 are simultaneously formed by the selective growth, the manufacturing steps can be reduced in numbers, and simplified.

The aforementioned manufacturing steps are described, as to for forming the beam waveguide layer 32 and the beam absorption layer 40 composed of the bulk crystal. However both of the beam waveguide layer 32 and the beam absorption layer 40 may be formed to have the MQW structure compositionally disordered by varying the doping dose of the implanted ion so that the bandgap of the beam waveguide 32 is greater than that of the beam absorption layer 40. As the result, both of the beam waveguide layer 32 and the beam absorption layer 40 can be easily formed with the bulk structure.

Although the active layer in the laser region C is formed of the MQW structure in the embodiment 1 and 2, it can be expected to enjoy the same effect when it is formed of the bulk crystal structure.

(Advantages of Invention)

The modulator-integrated semiconductor laser device according to the present invention is formed as described above, it has following effects.

The modulator-integrated semiconductor laser device according to the present invention comprises a first ridge-shaped waveguide deposited over a part of the first main surface of the semiconductor substrate, the first waveguide having an active layer and a longitudinal direction; a second ridge-shaped waveguide formed over the semiconductor substrate extending along the longitudinal direction to connect to the first waveguide, the second waveguide including a beam waveguide layer of bandgap greater than that of the active layer, the beam waveguide layer being formed of a bulk structure; a third ridge-shaped waveguide formed over the semiconductor substrate extending along the longitudinal direction to connect to the second waveguide, the third waveguide including a beam absorption layer of bandgap greater than that of the active layer but less than that of the beam waveguide layer, the beam waveguide layer being formed of a bulk structure; a first ridge-shaped clad layer of a second conductive type, deposited on the first, second, and third waveguides; a second ridge-shaped clad layer sandwiched between either one of the first clad layer or the substrate on one hand, and the first, second and third waveguides on the other hand; and a diffractive grating formed and embedded within the second clad layer opposing to the first waveguide. Therefore the device formed as described above advantageously has the improved frequency-characteristics by suppressing the influence of the unstable electric field due to the modulating signals applied to the modulator to minimize the fluctuation of the refractive index caused by the fluctuating beam absorption rate, and also by reducing the beam absorption rate in the beam waveguide layer in the separator region caused by the leakage electric field. Eventually there is an advantage that the frequency-characteristics of the modulator-integrated semiconductor laser device can be improved.

Further since the second waveguide is connected and aligned to the first waveguide through the composition face, there is an another advantage that it is easy to obtain the desired and improved frequency-characteristics while enjoying the high design flexibility for the laser region and the separator region.

Further since the third waveguide is connected and aligned to the second waveguide through the composition face and both of the beam waveguide layer and the beam absorption layer are formed of the bulk crystal structure, there is a further advantage that the modulator-integrated semiconductor laser device is improved in the frequency-characteristics by minimizing the beam absorption and is capable of high outputting.

Further since both of the waveguide layer and the beam absorption layer are formed by compositionally disordering to have multi quantum well structure and a compositional disordering ratio of the beam waveguide layer is higher than that of the beam absorption layer, there is a further advantage that the modulator-integrated semiconductor laser device with improved frequency-characteristics can be manufactured with a simple structure and at inexpensive cost.

Also since the beam waveguide layer of the second waveguide is thinner towards the first waveguide and thicker towards the third waveguide, there is a further advantage that the modulator-integrated semiconductor laser device is improved in the frequency-characteristics by suppressing the beam absorption and is capable of high outputting.

A modulator-integrated semiconductor laser device comprises a first ridge-shaped waveguide with an active layer, a second ridge-shaped waveguide extending along the longitudinal direction to connect to the first waveguide through a first composition face, the second waveguide including a beam waveguide layer of bandgap greater than that of the active layer, a third ridge-shaped waveguide extending along the longitudinal direction to connect to the second waveguide through a second composition face, the third waveguide including a beam absorption layer of a multi quantum well structure of bandgap greater than that of the active layer but less than that of the beam waveguide layer, a first ridge-shaped clad layer of a second conductive type deposited on the first, second, and third waveguides, a second ridge-shaped clad layer sandwiched between either one of the first clad layer or the substrate on one hand, and the first, second and third waveguides on the other hand, and a diffractive grating formed and embedded within the second clad layer corresponding to the first waveguide. Therefore there is an advantage that the modulator-integrated semiconductor laser device capable of high outputting is improved in stabilizing the frequency-characteristics and suppressing the beam absorption caused by the separator region less affected by the leakage electric field due to the modulating signals applied to the modulator.

Further since the beam waveguide layer is formed of a bulk crystal structure and the influence of the electric field due to the modulating signals applied to the modulator is suppressed, the modulator-integrated semiconductor laser device has an another advantage that its frequency-characteristics is improved.

Also since the beam waveguide is formed of a multi-quantum structure, the modulator-integrated semiconductor laser device has a further advantage that it can be provided such that the beam absorption is minimized and its frequency-characteristics is improved.

A process for manufacturing a modulator-integrated semiconductor laser device according to the present invention comprises steps of, forming a first stripe-shaped dielectric layer extending along a laser emitting direction and overlapping the diffractive grating, the first stripe-shaped dielectric layer having length less than that of the substrate, etching the resultant layer structure with the first dielectric layer as a mask until the semiconductor substrate is exposed, forming, in sequence, a second waveguide having a beam waveguide layer of bandgap greater than that of the active layer and a third clad layer of the second conductive type semiconductor with the first dielectric layer as a mask on an etched and exposed surface of the semiconductor substrate; removing the first dielectric layer, forming a stripe-shaped second dielectric layer on the second and third clad layers, the second dielectric layer covering over and extending more in the laser emitting direction than an portion of the first dielectric layer, and etching the resultant layer structure with the second dielectric layer as a mask until the substrate is exposed; and sequentially forming a third waveguide and a forth clad layer of the second conductive type semiconductor on the etched and exposed surface of the substrate, the third waveguide including a beam absorption layer of semiconductor having bandgap greater than that of the active layer but less than that of the beam waveguide layer. Therefore since the first, second, and third waveguide layers are independently formed, the modulator-integrated semiconductor laser device has an advantage that it can be provided easily with the improved frequency-characteristics and the high design flexibility.

Further the process for manufacturing a modulator-integrated semiconductor laser device according to the present invention comprises steps of, forming an opposing pair of second dielectric layers on the first clad layer having length less than that of the substrate extending along a laser emitting direction and overlapping the diffractive grating, the pair of second dielectric layers defining a stripe-shaped space therebetween, the stripe-shaped space extending from the first stripe-shaped dielectric layer along the laser emitting direction, each of the second dielectric layer having width narrower towards the first dielectric layer, and etching the resultant layer structure with the first and second dielectric layers as masks until the substrate is exposed; and sequentially forming by the selective growth a second waveguide of a semiconductor layer of bandgap greater than that of the active layer and a third clad layer of the second conductive type semiconductor with the first and second dielectric layer as masks on an etched and exposed surface of the substrate. Therefore since waveguides in both the separator region and modulator region are formed simultaneously, the modulator-integrated semiconductor laser device has an advantage that it can be provided in simplified steps with the improved frequency-characteristics.

Also the process for manufacturing a modulator-integrated semiconductor laser device comprises steps of, forming an opposing pair of first dielectric layers on a first main surface of a semiconductor substrate, the first dielectric layers extending along a laser emitting direction and defining a stripe-shaped space therebetween, each of the first dielectric layer having a longitudinal direction in the laser emitting direction from one end of the semiconductor substrate to an inside position and having width narrower towards the inside position, forming by a selective growth a first waveguide with a first semiconductor layer of bandgap less than that of the semiconductor substrate using the first dielectric layer as a mask until the substrate is exposed, removing the first dielectric layer, forming a second stripe-shaped dielectric layer on a surface of the first waveguide formed between the pair of first dielectric layers, etching using the second dielectric layer as a mask until the semiconductor substrate is exposed, forming by the selective growth a second waveguide using the second dielectric layer as a mask on an etched and exposed surface of the semiconductor substrate, the second waveguide having an active layer of bandgap less than that of the first semiconductor layer, removing the second dielectric layer, forming a first clad layer of the second conductive type semiconductor and a beam guide layer of the second conductive type semiconductor in sequence on the first and second waveguides, etching the beam guide to form a diffractive grating opposing to the active layer, and embedding the diffractive grating within the second clad layer of the second conductive type semiconductor. Therefore since waveguides in both the separator region and modulator region are formed simultaneously, the modulator-integrated semiconductor laser device has advantage that it can be provided in simple steps with the improved frequency-characteristics.

Further the process for manufacturing a modulator-integrated semiconductor laser device comprises steps of, preparing a layer structure including, a first clad layer of a first conductive type semiconductor deposited on a first main surface of a semiconductor substrate of the first conductive type semiconductor, the first clad layer opposing to a diffractive grating and extending along a laser emitting direction with length less than that of the semiconductor substrate, forming an opposing pair of first dielectric layers on a surface of a first clad layer, the first dielectric layers extending along the laser emitting direction and defining a stripe-shaped space between them, each of the first dielectric layer having one end adjacent to the diffractive grating and the other end, and having width narrower at the one end than that at the other end, and forming by a selective growth a first waveguide with using the first dielectric layer as a mask on the substrate, the first waveguide with an active layer of bandgap less than that of the first semiconductor layer, forming a second stripe-shaped dielectric layer on a surface of the first waveguide, having a longitudinal length as the first dielectric layer formed between the pair of first dielectric layers, etching using the second dielectric layer as a mask until the semiconductor substrate is exposed, forming by the selective growth a second waveguide using the second dielectric layer as a mask on the semiconductor substrate, the second waveguide having an active layer of bandgap less than that of the first semiconductor layer. Therefore since waveguides in both the separator region and modulator region are formed at one time, the modulator-integrated semiconductor laser device has an advantage that it can be provided in simplified steps with the improved frequency-characteristics.

What is claimed is:

1. A process for manufacturing an integrated semiconductor laser-modulator device comprising:
    preparing a layer structure including,
        depositing a first waveguide layer having a first conductivity type on a first main surface of a semiconductor substrate, the first waveguide having an active layer with a bandgap energy,
        depositing a first cladding layer having a second conductivity type on the first waveguide layer, and
        depositing a second cladding layer having an embedded diffraction grating between the first waveguide layer and one of the first cladding layer and the substrate;
    forming a stripe-shaped first dielectric layer extending along a laser emitting direction and overlapping the diffraction grating, the first dielectric layer having a length shorter than the substrate, and
    etching, using the first dielectric layer as a mask, until the semiconductor substrate is exposed;
    forming, in sequence, a second waveguide layer having a beam waveguide layer with a bandgap energy larger than the bandgap energy of the active layer and a third cladding layer of a second conductivity type semiconductor, using the first dielectric layer as a mask, on an etched and exposed surface of the semiconductor substrate;
    removing the first dielectric layer,
    forming a stripe-shaped second dielectric layer on the second and third cladding layers, the second dielectric layer covering and extending farther in a laser emitting direction than a portion of the first dielectric layer, and
    etching, using the second dielectric layer as a mask, until the substrate is exposed;
    sequentially forming a third waveguide layer and a fourth cladding layer having the second conductivity type on the etched and exposed substrate, the third waveguide layer including a beam absorption layer having a bandgap energy larger than the bandgap energy of the active layer but smaller than the bandgap energy of the beam waveguide layer; and
    removing the second dielectric layer,
    forming a stripe-shaped third dielectric layer on the second, third, and fourth cladding layers, the third dielectric layer covering and extending farther in the laser emitting direction than the second, third, and fourth cladding layers,
    etching, using the third dielectric layer as a mask, until the substrate is exposed, to form a ridge, and
    forming a current blocking layer on the etched and exposed substrate.

2. A process for manufacturing an integrated semiconductor laser-modulator device comprising:
    first, preparing a layer structure including,
        depositing a first waveguide including a semiconductor having a first conductivity type on a first main surface of a semiconductor substrate, the first waveguide having an active layer,
        depositing a first cladding layer having a second conductivity type semiconductor on the first waveguide, and
        forming a second cladding layer of a semiconductor having an embedded diffraction grating between the first waveguide and one of the first cladding layer and the substrate;
    second,
        forming a stripe-shaped first dielectric layer on the first cladding layer, having a length less than that of the substrate, extending along a laser emitting direction and overlapping the diffraction grating,
        forming an opposing pair of second dielectric layers on the first cladding layer, spaced apart and defining a stripe-shaped space therebetween, the stripe-shaped space extending from the first dielectric layer along the laser emitting direction, each of the second dielectric layers having a first end adjacent to the first dielectric layer and a narrower width than a second end, and
        etching, using the first and second dielectric layers as masks, until the substrate is exposed;
    third,
        sequentially forming, by selective growth, a second waveguide of a semiconductor layer having a bandgap energy larger than that of the active layer, and a third cladding layer of a second conductivity type semiconductor, using the first and second dielectric layers as masks, on an etched and exposed surface of the substrate; and fourth,
removing the first and second dielectric layers,
forming a stripe-shaped third dielectric layer on a surface of the second and third cladding layers, the third dielectric layer covering and extending farther in the laser emitting direction than the second and third cladding layers,
etching, with the third dielectric layer as a mask, until the substrate is exposed, to form a ridge, and
forming a current blocking layer on the etched and exposed surface of the substrate.

3. A process for manufacturing an integrated semiconductor laser-modulator device comprising:

first,
forming an opposing pair of first dielectric layers on a substrate, spaced apart and defining a stripe-shaped space therebetween, the stripe-shaped space extending along a laser emitting direction, each of the first dielectric layers having a length less than that of the substrate and a first end with a narrower width than a second end, and
forming, by selective growth, a first waveguide of a semiconductor having a bandgap energy smaller than that of the semiconductor substrate, using the first dielectric layers as a mask, on the semiconductor substrate;

second,
removing the first dielectric layers,
forming a stripe-shaped second dielectric layer on the first waveguide located between the pair of first dielectric layers, and having the same length as the first dielectric layer, and
etching, using the second dielectric layer as a mask, until the semiconductor substrate is exposed;

third,
forming, by selective growth, a second waveguide, using the second dielectric layer as a mask, on an etched and exposed surface of the semiconductor substrate, the second waveguide including an active layer having a bandgap energy smaller than that of the first semiconductor layer;

fourth,
removing the second dielectric layer,
forming a first cladding layer of a second conductivity type semiconductor and a beam guide layer of a second conductivity type semiconductor in sequence on the first and second waveguides,
etching the beam guide layer to form a diffraction grating opposing the active layer, and
embedding the diffraction grating within a second cladding layer of the second conductivity type; and fifth,
forming a stripe-shaped third dielectric layer on the second cladding layer, the third dielectric layer extending along the laser emitting direction, and having a width narrower than that of the second dielectric layer and a length covering the first semiconductor layer and the active layer,
etching, using the third dielectric layer as a mask, until the semiconductor substrate is exposed, to form a ridge, and
forming a current blocking layer on an etched and exposed surface of the semiconductor substrate.

4. A process for manufacturing an integrated semiconductor laser-modulator device comprising:

first,
depositing a layer structure including a first cladding layer of a first conductivity type semiconductor on a first main surface of a semiconductor substrate of a first conductivity type, the first cladding layer opposing a diffraction grating extending along a laser emitting direction and having a length less than that of the semiconductor substrate;

second,
forming an opposing pair of first dielectric layers on a surface of the first cladding layer, extending along the laser emitting direction, spaced apart and defining a stripe-shaped space therebetween, each of the first dielectric layers having a first end adjacent to the diffraction grating and a second end, and having a width narrower at the first end than at the second end, and
forming, by selective growth, a first waveguide, using the first dielectric layers as a mask, on the first cladding layer, the first waveguide having a first semiconductor layer having a bandgap energy smaller than that of the first cladding layer;

third,
forming a stripe-shaped second dielectric layer on the first waveguide, the second dielectric layer having a length as long as the first semiconductor layer between the pair of first dielectric layers, and
etching, using the second dielectric layer as a mask, until the first cladding layer is exposed;

fourth,
forming, by selective growth, a second waveguide, using the second dielectric layer as a mask, on the first cladding layer, the second waveguide having an active layer with a bandgap energy smaller than that of the first semiconductor layer;

fifth,
removing the second dielectric layer, and
forming a second cladding layer on the first and second waveguides; and sixth,
forming a stripe-shaped third dielectric layer on the second cladding layer, extending along the laser emitting direction, narrower than the second dielectric layer and having a length covering the first semiconductor layer and the active layer,
etching, using the third dielectric layer as a mask, until the semiconductor substrate is exposed, to form a ridge, and
forming a current blocking layer on the etched and exposed surface of the semiconductor substrate.

* * * * *